(12) United States Patent
Lee et al.

(10) Patent No.: US 12,426,259 B2
(45) Date of Patent: Sep. 23, 2025

(54) INTEGRATED CIRCUIT DEVICE

(71) Applicant: Samsung Electronics Co., Ltd., Suwon-si (KR)

(72) Inventors: Hyeran Lee, Suwon-si (KR); Junhyeok Ahn, Suwon-si (KR); Kiseok Lee, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 453 days.

(21) Appl. No.: 18/148,566

(22) Filed: Dec. 30, 2022

(65) Prior Publication Data
US 2023/0413538 A1 Dec. 21, 2023

(30) Foreign Application Priority Data

May 25, 2022 (KR) .................. 10-2022-0064252

(51) Int. Cl.
 *H10B 12/00* (2023.01)
 *H01L 23/528* (2006.01)
 *H10D 64/27* (2025.01)

(52) U.S. Cl.
 CPC ....... *H10B 12/488* (2023.02); *H01L 23/5283* (2013.01); *H10B 12/482* (2023.02); *H10D 64/513* (2025.01)

(58) Field of Classification Search
 CPC .. H10B 12/488; H10B 12/482; H10B 12/053; H10B 12/315; H10B 12/34; H10B 12/0335; H10B 12/31; H01L 23/5283; H01L 21/74; H10D 64/513
 See application file for complete search history.

(56) References Cited

U.S. PATENT DOCUMENTS

| | | | |
|---|---|---|---|
| 8,012,828 B2 | 9/2011 | Min et al. |
| 8,691,680 B2 | 4/2014 | Wang |
| 9,136,270 B2 | 9/2015 | Kim et al. |
| 9,536,971 B2 | 1/2017 | Juengling |
| 9,728,617 B2 | 8/2017 | Poelzl |
| 10,103,152 B2 | 10/2018 | Kim et al. |

(Continued)

FOREIGN PATENT DOCUMENTS

| | | |
|---|---|---|
| KR | 101983309 B1 | 5/2019 |
| KR | 20200131191 A | 11/2020 |

(Continued)

*Primary Examiner* — Mohammed R Alam
(74) *Attorney, Agent, or Firm* — Wolf, Greenfield & Sacks, P.C.

(57) ABSTRACT

An integrated circuit device includes a substrate comprising an active region and a word line trench, a word line extending longitudinally in a first horizontal direction in the word line trench, a buried insulating layer on the word line, a conductive plug on the substrate, and a pad structure on the substrate and having a portion in contact with a top surface of the active region and a portion in contact with the conductive plug. The pad structure includes a conductive pad having a bottom surface in contact with the top surface of the active region and a pad spacer in contact with a sidewall of the conductive pad and protruding beyond an inner sidewall of the word line trench in a second horizontal direction orthogonal to the first horizontal direction such that the pad spacer vertically overlaps a portion of the word line in the word line trench.

20 Claims, 37 Drawing Sheets

(56) References Cited

U.S. PATENT DOCUMENTS

| | | |
|---|---|---|
| 11,444,087 B2 | 9/2022 | Su |
| 2012/0168857 A1 | 7/2012 | Lee et al. |
| 2012/0280313 A1 | 11/2012 | Shin et al. |
| 2013/0009226 A1 | 1/2013 | Park et al. |
| 2013/0137258 A1 | 5/2013 | Shin et al. |
| 2021/0035984 A1 | 2/2021 | Ji et al. |
| 2021/0375878 A1* | 12/2021 | Zhang .................. H10B 12/315 |
| 2024/0057315 A1* | 2/2024 | Tung .................... H10B 12/485 |

FOREIGN PATENT DOCUMENTS

| | | |
|---|---|---|
| TW | 200947669 A | 11/2009 |
| TW | 201304072 A | 1/2013 |
| TW | 202141736 A | 11/2021 |

\* cited by examiner

Y1 – Y1'

Y1 – Y1'

INTEGRATED CIRCUIT DEVICE

CROSS-REFERENCE TO RELATED APPLICATION

This application is based on and claims priority under 35 U.S.C. § 119 to Korean Patent Application No. 10-2022-0064252, filed on May 25, 2022, in the Korean Intellectual Property Office, the disclosure of which is incorporated by reference herein in its entirety.

TECHNICAL FIELD

The inventive concept relates to an integrated circuit device, and more particularly, to an integrated circuit device having a buried word line.

BACKGROUND

An increase in the degree of integration of an integrated circuit device can result in a reduction in the pitch of conductive lines, and accordingly, a technology for securing a reliable electrical connection between adjacent conductive regions may be beneficial.

SUMMARY

The inventive concept provides an integrated circuit device having a device region of a reduced area according to down-scaling, thereby securing a reliable electrical connection between adjacent conductive regions.

According to an aspect of the inventive concept, there is provided an integrated circuit device including a substrate including an active region and a word line trench extending longitudinally in a first horizontal direction across the active region, a word line in the word line trench and extending longitudinally in the first horizontal direction at a vertical level lower than a main surface of the substrate, a buried insulating layer on the word line in the word line trench, a conductive plug on the substrate, and a pad structure on the substrate and having a first portion in contact with a top surface of the active region and a second portion in contact with the conductive plug, wherein the pad structure includes a conductive pad having a bottom surface in contact with the top surface of the active region and a first sidewall extending along an extension line of an inner sidewall of the word line trench, and a pad spacer in contact with the first sidewall of the conductive pad and protruding beyond the inner sidewall of the word line trench in a second horizontal direction orthogonal to the first horizontal direction such that the pad spacer vertically overlaps a portion of the word line in the word line trench.

According to another aspect of the inventive concept, there is provided an integrated circuit device including a substrate including a plurality of active regions spaced apart from each other and a plurality of word line trenches each extending longitudinally in a first horizontal direction across some of the plurality of active regions, a plurality of word lines each inside respective ones of the plurality of word line trenches and extending longitudinally in the first horizontal direction at a vertical level lower than a main surface of the substrate, a plurality of bit lines extending longitudinally in a second horizontal direction perpendicular to the first horizontal direction on the substrate, a plurality of conductive plugs respectively in spaces between each of the plurality of bit lines and electrically connected to one active region of the plurality of active regions, and a plurality of pad structures between the substrate and the plurality of conductive plugs, wherein each of the plurality of pad structures includes a conductive pad having opposite sidewalls in the second horizontal direction and a bottom surface, the bottom surface being in contact with the main surface of the substrate between a pair of word line trenches of the plurality of word line trenches and adjacent to each other, and the opposite sidewalls extending along an extension line of an inner sidewall of each of the pair of word line trenches, and one or more pad spacers in contact with the opposite sidewalls of the conductive pad and protruding beyond the inner sidewall of each of the pair of word line trenches such that the one or more pad spacers vertically overlaps a portion of a word line of the plurality of word lines inside each of the pair of word line trenches.

According to another aspect of the inventive concept, there is provided an integrated circuit device including a substrate having a plurality of active regions and a main surface, a plurality of word lines buried in the substrate at a vertical level lower than the main surface and extending longitudinally in a first horizontal direction, a plurality of gate dielectric layers respectively surrounding the plurality of word lines, a plurality of bit lines extending longitudinally in a second horizontal direction perpendicular to the first horizontal direction on the substrate, a plurality of direct contacts each between one bit line of the plurality of bit lines and one active region of the plurality of active regions, a plurality of conductive plugs each in a space between respective ones of the plurality of bit lines on the substrate, and a plurality of pad structures respectively between the plurality of active regions and the plurality of conductive plugs and spaced apart from the plurality of direct contacts, wherein each of the plurality of pad structures has a first portion in contact with one active region of the plurality of active regions, and a second portion in contact with one conductive plug of the plurality of conductive plugs, each of the plurality of pad structures includes a conductive pad having a bottom surface in contact with the main surface of the substrate and opposite sidewalls in the second horizontal direction, and one or more pad spacers in contact with the opposite sidewalls of the conductive pad, having a bottom surface with a vertical level equal to or higher than a vertical level of the bottom surface of the conductive pad, and including a portion overlapping one gate dielectric layer of the plurality of gate dielectric layers.

BRIEF DESCRIPTION OF THE DRAWINGS

Embodiments of the present disclosure will be more clearly understood from the following detailed description taken in conjunction with the accompanying drawings, in which:

FIG. 2A is a cross-sectional view of some configurations taken along a line X1-X1' of FIG. 1, FIG. 2B is a cross-sectional view of some configurations taken along a line Y1-Y1' of FIG. 1, and FIG. 2C is a cross-sectional view of some configurations taken along a line X2-X2' of FIG. 1;

FIGS. 11A, 12A, 13A, 14A, 15A, 16A, 17A, and 18A are cross-sectional views of some regions taken along the line X1-X1' in FIG. 1 according to a process sequence, and FIGS. 11B, 12B, 13B, 14B, 15B, 16B, 17B, and 18B are cross-sectional views of some regions taken along the line Y1-Y1' of FIG. 1;

FIGS. 21A and 22A are cross-sectional views sequentially illustrating some regions taken along the line X1-X1' in FIG. 1, and FIGS. 21B and 22B are cross-sectional views sequentially illustrating some regions taken along the line Y1-Y1' of FIG. 1.

DETAILED DESCRIPTION

Figure 1:
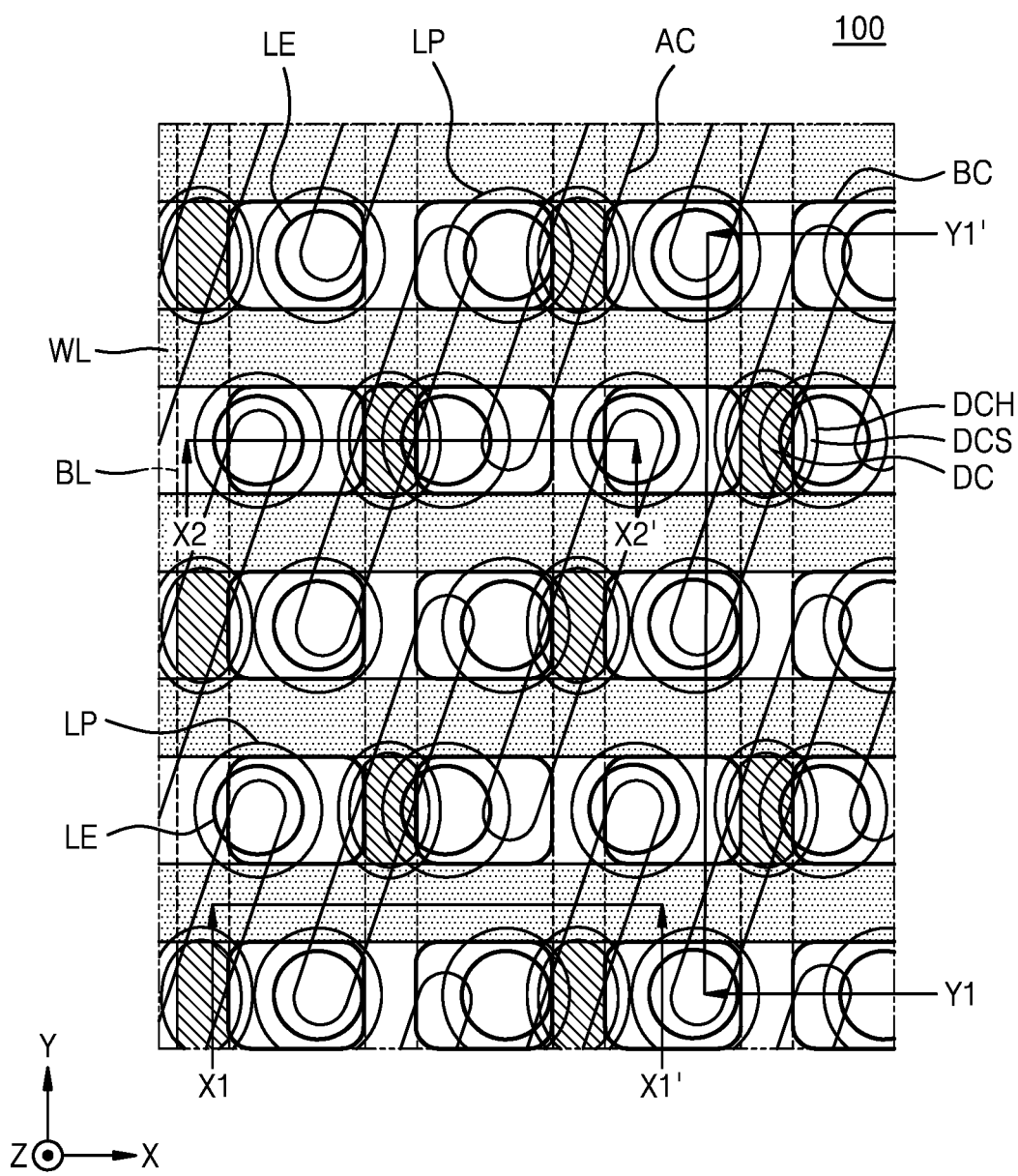
FIG. 1 is a schematic plan layout illustrating some configurations of a memory cell array region of an integrated circuit device according to some embodiments.

Hereinafter, embodiments of the present disclosure will be described in detail with reference to the accompanying drawings. The same reference numerals are used for the same components in the drawings, and redundant descriptions thereof are omitted.

FIG. 1 is a schematic plan layout illustrating some configurations of a memory cell array region of an integrated circuit device 100 according to some embodiments.

Referring to FIG. 1, the integrated circuit device 100 may include a plurality of active regions AC arranged to extend horizontally in a diagonal direction with respect to a first horizontal direction (X direction) and a second horizontal direction (Y direction) orthogonal (i.e., perpendicular) to each other on a plane. A plurality of word lines WL may extend parallel to each other in the first horizontal direction (X direction) across the plurality of active regions AC. A plurality of bit lines BL may extend parallel to each other in the second horizontal direction (Y direction) on the plurality of word lines WL. A plurality of direct contacts DC may be disposed below the plurality of bit lines BL. Each of the plurality of direct contacts DC may have a sidewall disposed in a direct contact hole DCH and surrounded by a contact insulating spacer DCS. Each of the plurality of bit lines BL may be electrically connected to one or more of the plurality of active regions AC through respective ones of the plurality of direct contacts DC.

A plurality of buried contacts BC may be disposed between two adjacent bit lines BL among the plurality of bit lines BL. A plurality of conductive landing pads LP may be respectively disposed on the plurality of buried contacts BC. Each of the plurality of conductive landing pads LP may be disposed to at least partially overlap the buried contact BC. A plurality of lower electrodes LE spaced apart from each other may be respectively formed on the plurality of conductive landing pads LP. The plurality of lower electrodes LE may be respectively electrically connected to the plurality of active regions AC through the plurality of buried contacts BC and the plurality of conductive landing pads LP.

Figure 2A:
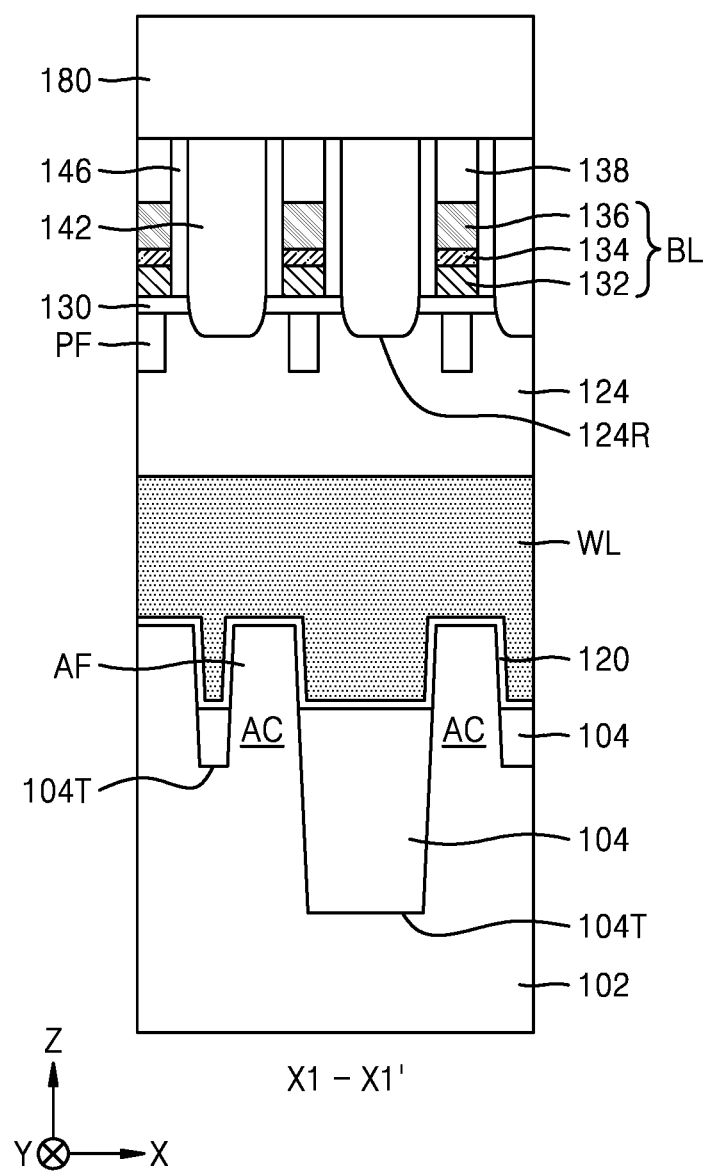
FIGS. 2A to 2C are diagrams illustrating an integrated circuit device according to some embodiments.
Figure 2B:
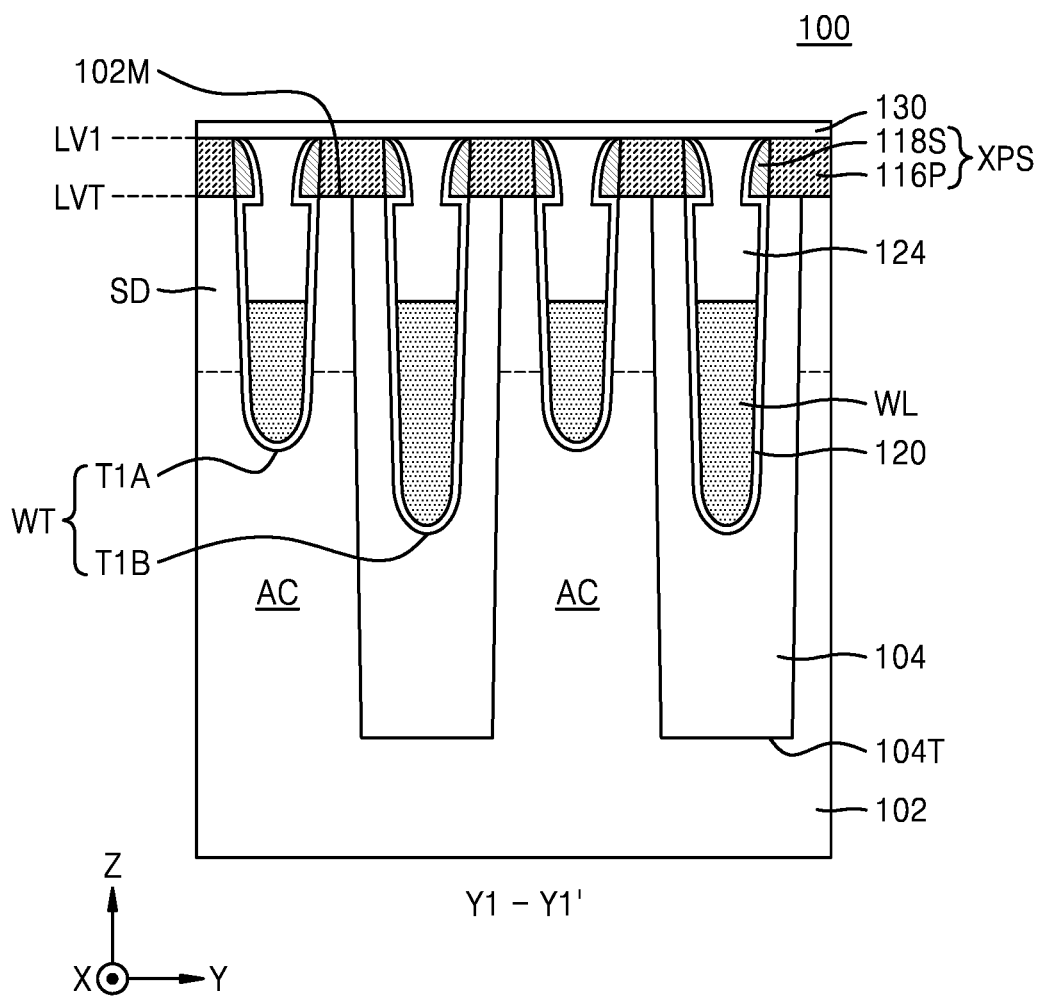
Figure 2C:
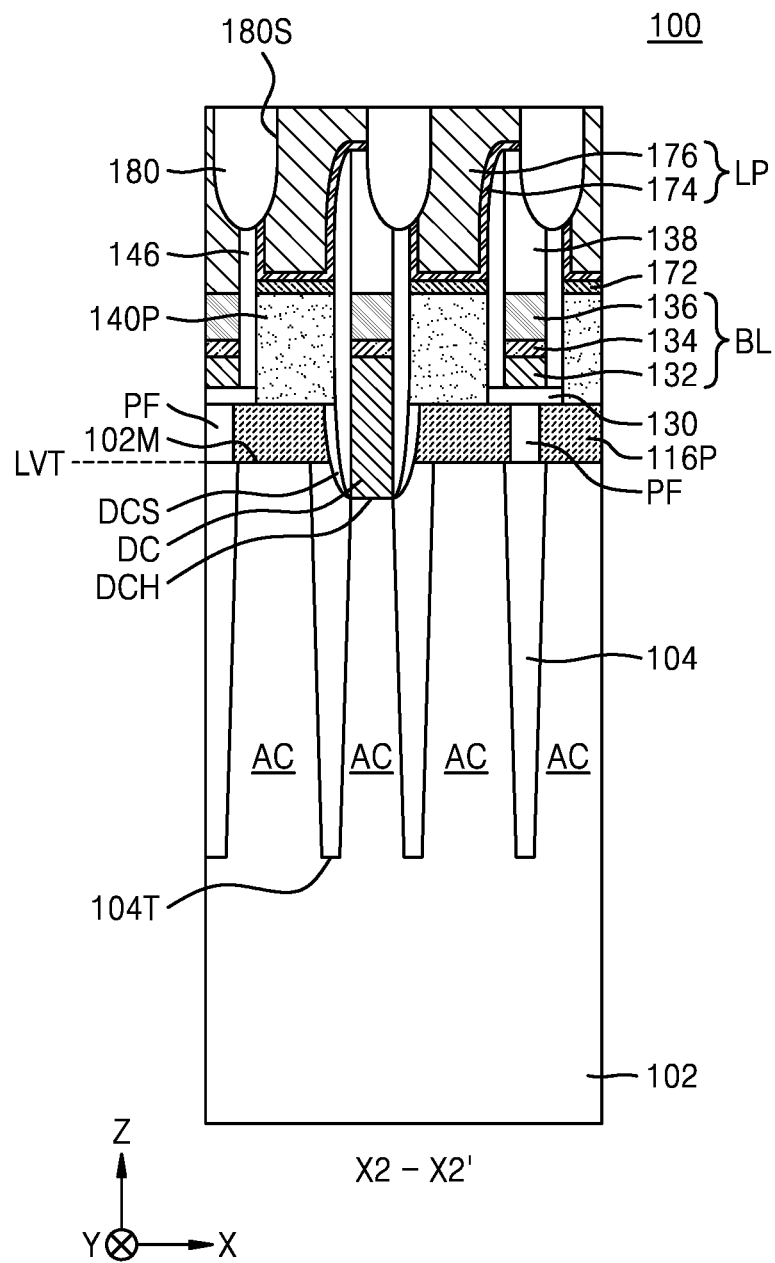

FIGS. 2A to 2C are diagrams illustrating the integrated circuit device 100 according to some embodiments. FIG. 2A is a cross-sectional view of some configurations taken along a line X1-X1' of FIG. 1, FIG. 2B is a cross-sectional view of some configurations taken along a line Y1-Y1' of FIG. 1, and FIG. 2C is a cross-sectional view of some configurations taken along a line X2-X2' of FIG. 1.

Referring to FIGS. 2A to 2C, the integrated circuit device 100 may include a substrate 102 including the plurality of active regions AC defined by a device isolation trench 104T. The plurality of active regions AC may be spaced apart from each other in a horizontal direction (e.g., an X direction and a Y direction).

The device isolation trench 104T may be filled with a device isolation layer 104. The device isolation layer 104 may surround the plurality of active regions AC on the substrate 102. The device isolation layer 104 may include a silicon oxide layer, a silicon nitride layer, or a combination thereof. A level of a bottom surface of the device isolation trench 104T may vary depending on a horizontal width of the device isolation trench 104T. An increase in the horizontal width of the device isolation trench 104T may result in a decrease in a vertical level of the bottom surface of the device isolation trench 104T. As used herein, the term "vertical level" means a height in a vertical direction (Z direction or −Z direction) from a main surface 102M of the substrate 102.

The substrate 102 may include silicon, for example, monocrystalline silicon, polycrystalline silicon, or amorphous silicon. In some embodiments, the substrate 102 may include at least one selected from Ge, SiGe, SiC, GaAs, InAs, and/or InP. As used herein, the term "and/or" includes any and all combinations of one or more of the associated listed items. In some embodiments, the substrate 102 may include a conductive region, for example, a dopant doped well, or a dopant doped structure. The substrate 102 may have the main surface 102M.

The substrate 102 may include a plurality of word line trenches WT extending parallel to each other in the first horizontal direction (X direction). The plurality of word line trenches WT may extend longitudinally in the first horizontal direction (X direction) across the plurality of active regions AC. In some embodiments, the plurality of word line trenches WT may have widths in the second horizontal direction (Y direction) that decrease when moving away from the main surface 102M of the substrate 102.

A gate dielectric layer 120, the word line WL, and a buried insulating layer 124 may be disposed inside each of the plurality of word line trenches WT. The word line WL may be buried in the substrate 102 at a lower vertical level than the main surface 102M of the substrate 102 and may extend longitudinally in the first horizontal direction (X direction). The buried insulating layer 124 may cover the word line WL in the word line trench WT. The gate dielectric layer 120 may surround the word line WL and the buried insulating layer 124 in the word line trench WT.

Vertical levels of bottom surfaces of parts of the plurality of word line trenches WT on the plurality of active regions AC may be higher than vertical levels of bottom surfaces of parts of the plurality of word line trenches WT on the device isolation layer 104. For example, bottom surfaces of parts of the plurality of word line trenches WT on the plurality of active regions AC may be closer, in the vertical direction (Z direction), to the main surface 102M of the substrate 102 than bottom surfaces of parts of the plurality of word line trenches WT on the device isolation layer 104. Accordingly, bottom profiles of the plurality of word line trenches WT may have an uneven shape, and a bottom surface of the word line WL may have the uneven shape in correspondence to the bottom profile of the word line trench WT. In the plurality of active regions AC, a plurality of fin regions AF may be formed to protrude upward in the vertical direction (Z direction) from a lower portion of the word line WL toward the word line WL in correspondence to the bottom profile of the word line trench WT. The plurality of word line trenches WT may include a first trench portion T1A and a second trench portion T1B located in the substrate 102 and having bottom surfaces with different vertical levels from each other.

The gate dielectric layer 120 may conformally cover an inner surface of the word line trench WT so as to be in contact with the active region AC and the device isolation layer 104. The gate dielectric layer 120 may include a silicon oxide layer, a silicon oxynitride layer, an oxide/nitride/oxide (ONO) layer, a metal oxide layer of a high-k dielectric film, or a combination thereof. The high-k dielectric film is a film having a higher dielectric constant than that of the silicon oxide layer. The high-k dielectric film may have a dielectric constant of about 10 to about 25 and may include, for example, $HfO_2$, $Al_2O_3$, $HfAlO_3$, $Ta_2O_3$, or $TiO_2$, but is not limited thereto. The gate dielectric layer 120 may have a thickness of about 10 nm to about 30 nm.

Each of the plurality of word lines WL may fill a part of a respective one of the plurality of word line trenches WT on the gate dielectric layer 120. A metal containing barrier layer (not shown) may be disposed between the word line WL and the gate dielectric layer 120 in the word line trench WT. The metal containing barrier layer may be in contact with the gate dielectric layer 120. The metal containing barrier layer may include a metal nitride layer. The plurality of word lines WL may be formed of a metal, a conductive metal nitride, a metal carbide, or a combination thereof. In some embodiments, the plurality of word lines WL may be formed of Ti, TiN, Ta, TaN, W, WN, TiSiN, WSiN, or a combination thereof. In some embodiments, the plurality of word lines WL may include a lower word line formed of a metal, a conductive metal nitride, a conductive metal carbide, or a combination thereof, and an upper word line formed of doped polysilicon. In this case, a metal containing barrier layer (not shown) may be disposed between the lower word line and the gate dielectric layer 120. For example, the metal containing barrier layer (not shown) may be formed of TiN, the lower word line may be formed of W, and the upper word line may be formed of doped polysilicon, but the present disclosure is not limited thereto.

The buried insulating layer 124 may fill the remaining space of the word line trench WT on the plurality of word lines WL. The buried insulating layer 124 may include a silicon nitride layer, a silicon oxynitride layer, a silicon oxide layer, or a combination thereof. A plurality of source/drain regions SD may be formed on opposite sides of the plurality of word lines WL in the plurality of active regions AC.

As illustrated in FIGS. 2B and 2C, a plurality of expanded pad structures XPS may be disposed on the main surface 102M of the substrate 102. Each of the plurality of expanded pad structures XPS may include a part in contact with one active region AC selected from among the plurality of active regions AC. Each of the plurality of expanded pad structures XPS may include a conductive expanded pad 116P and one or more expanded pad spacers 118S. The conductive expanded pad 116P may have opposite sidewalls in the first horizontal direction (X direction) and opposite sidewalls in the second horizontal direction (Y direction). The one or more expanded pad spacers 118S may cover each of the opposite sidewalls of the conductive expanded pad 116P in the second horizontal direction (Y direction). As illustrated in FIG. 2C, the one or more expanded pad spacers 118S may not cover either of the opposite sidewalls of the conductive expanded pad 116P in the first horizontal direction (X direction).

As illustrated in FIG. 2B, a bottom surface of the conductive expanded pad 116P may be in contact with the main surface 102M of the substrate 102 between a pair of word line trenches WT selected from among the plurality of word line trenches WT and adjacent to each other. The bottom surface of the conductive expanded pad 116P may be in contact with a top surface of the active region AC and a top surface of the device isolation layer 104. The opposite sidewalls of the conductive expanded pad 116P in the second horizontal direction (Y direction) may extend along an extension line of an inner sidewall of each of the pair of word line trenches WT on both sides of the conductive expanded pad 116P in the vertical direction (Z direction) moving away from the main surface 102M of the substrate 102. The opposite sidewalls of the conductive expanded pad 116P in the second horizontal direction (Y direction) may be on the inner sidewall of each of the pair of word line trenches WT.

As illustrated in FIG. 2B, the one or more expanded pad spacers 118S may be in contact with the opposite sidewalls of the conductive expanded pad 116P in the second horizontal direction (Y direction). The one or more expanded pad spacers 118S may not cover a top surface of the conductive expanded pad 116P in the vertical direction (Z direction). The one or more expanded pad spacers 118S may protrude farther toward the word line trench WT in the second horizontal direction (Y direction) than the inner sidewall of the word line trench WT adjacent to the conductive expanded pad 116P among the inner sidewalls of each of the pair of word line trenches WT on both sides of the conductive expanded pad 116P. For example, the one or more expanded pad spacers 118S may protrude beyond the inner sidewall of the word line trench WT in the second horizontal direction (Y direction) such that the one or more expanded pad spacers 118S vertically overlaps (i.e., overlaps in the Z direction) a portion of the word line WL in the word line trench WT. Accordingly, as illustrated in FIG. 2B, the one or more expanded pad spacers 118S may include a part overlapping the gate dielectric layer 120 in the vertical direction (Z direction). For example, the one or more expanded pad spacers 118S may include a part overlapping the gate dielectric layer 120 inside the word line trench WT in the vertical direction (Z direction).

The conductive expanded pad 116P may be formed of doped polysilicon, and the one or more expanded pad spacers 118S may be formed of doped polysilicon or undoped polysilicon. In some embodiments, the conductive expanded pad 116P and the one or more expanded pad spacers 118S may be each formed of doped polysilicon and may have the same doping concentration. In some embodiments, the conductive expanded pad 116P and the one or more expanded pad spacers 118S may be each formed of doped polysilicon and may have different doping concentrations. For example, the doping concentration of the conductive expanded pad 116P may be greater than the doping concentration of the one or more expanded pad spacers 118S. In some embodiments, the conductive expanded pad 116P may be formed of doped polysilicon, and the one or more expanded pad spacers 118S may be formed of undoped polysilicon. When at least one of the conductive expanded pad 116P and the one or more expanded pad spacers 118S is formed of doped polysilicon, a dopant of the doped polysilicon may be phosphorous (P), and the doping concentration may be selected within the range of about 5E20/cm$^3$ to about 20E20/cm$^3$, but is not limited thereto.

In some embodiments, as illustrated in FIG. 2B, the gate dielectric layer 120 and the buried insulating layer 124 may each protrude from inside the substrate 102 to a higher vertical level than a vertical level LVT of the main surface 102M of the substrate 102. The gate dielectric layer 120 and the buried insulating layer 124 may each include a part disposed between a pair of expanded pad structures XPS selected from among the plurality of expanded pad structures XPS.

A vertical level of a bottom surface of each of the plurality of expanded pad structures XPS may correspond to the vertical level LVT of the main surface 102M of the substrate 102. In each of the plurality of expanded pad structures XPS, the bottom surface of the conductive expanded pad 116P may be at the same vertical level LVT as the bottom surface of the one or more expanded pad spacers 118S. The uppermost surface of each of the buried insulating layer 124, the gate dielectric layer 120, and the expanded pad structure XPS may be at the same vertical level. As illustrated in FIG. 2B, the uppermost surface of each of the buried insulating layer 124, the gate dielectric layer 120, and the expanded pad structure XPS may be at a first vertical level LV1 higher than the vertical level LVT of the main surface 102M of the substrate 102. For example, the first vertical level LV1 may be a vertical level of a top surface of the conductive expanded pad 116P and a top surface of the one or more expanded pad spacers 118S.

As illustrated in FIG. 2B, the buried insulating layer 124 may include an upper portion disposed between the pair of expanded pad structures XPS selected from among the plurality of expanded pad structures XPS having a width in the second horizontal direction (Y direction) that is smaller than a width of a lower portion thereof directly on the word line WL. The upper portion of the buried insulating layer 124 disposed between the pair of expanded pad structures XPS selected from among the plurality of expanded pad structures XPS may have a width that changes when moving in the vertical direction (Z direction) from the vertical level LVT of the main surface 102M of the substrate 102 to the first vertical level LV1. For example, the width of the upper portion of the buried insulating layer 124 disposed between the pair of expanded pad structures XPS selected from among the plurality of expanded pad structures XPS may increase when moving the in the vertical direction (Z direction) from the vertical level LVT of the main surface 102M of the substrate 102 to the first vertical level LV1. However, the present disclosure is not limited thereto. The gate dielectric layer 120 may include a part extending in the second horizontal direction (Y direction) at the vertical level adjacent to the bottom surface of the one or more expanded pad spacers 118S or at the vertical level adjacent to the main surface 102M of the substrate 102.

Figure 3:
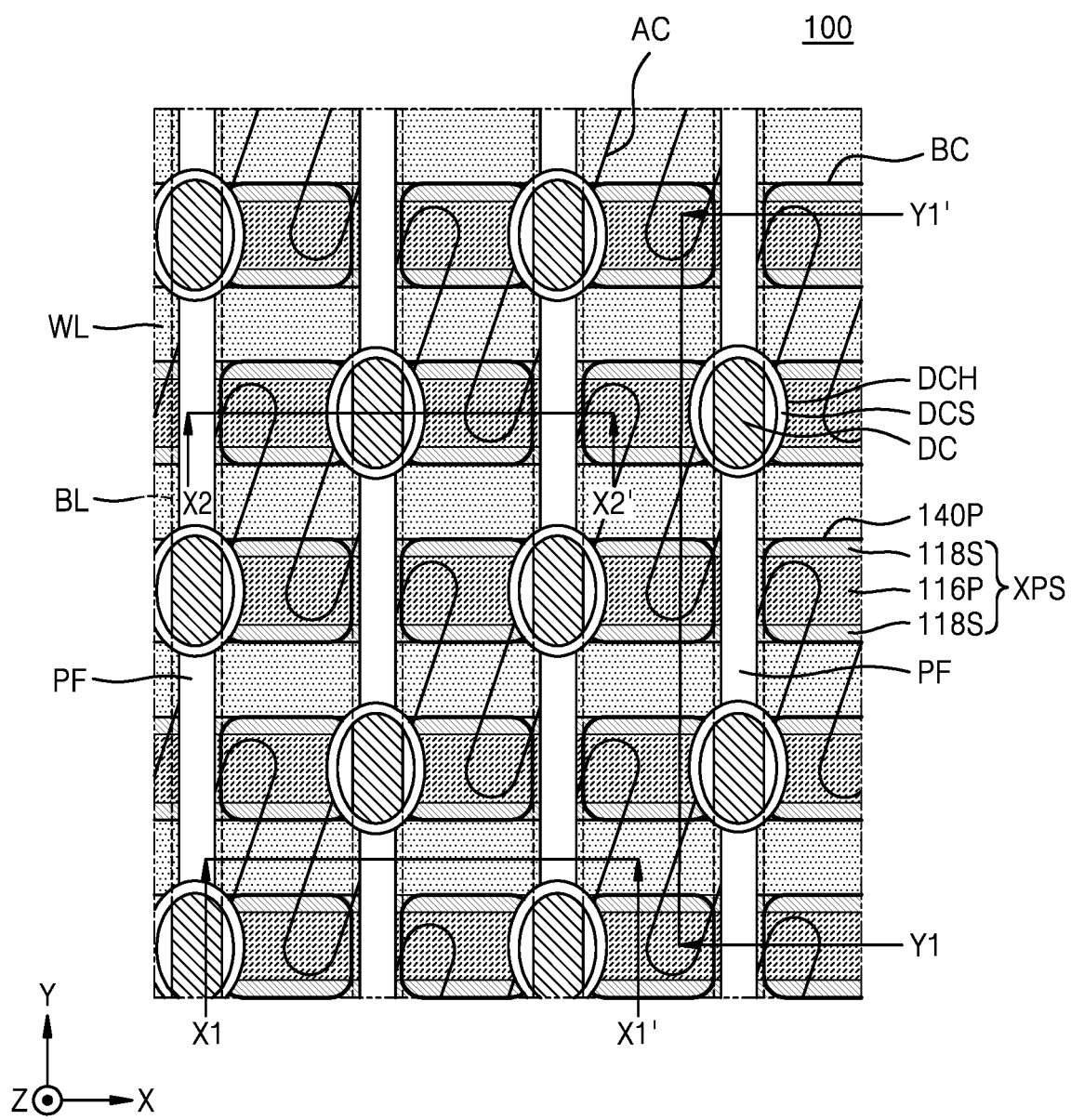
FIG. 3 is a schematic layout of some components of the integrated circuit device illustrated in FIGS. 2A to 2C.

FIG. 3 is a schematic layout of some components of the integrated circuit device 100 illustrated in FIGS. 2A to 2C.

As illustrated in FIGS. 2A, 2C, and 3, a plurality of pad separation fences PF may be disposed at positions spaced apart from each other in the first horizontal direction (X direction) on the substrate 102. The plurality of pad separation fences PF may have a planar shape extending longitudinally in the second horizontal direction (Y direction). As illustrated in FIG. 3, each of the plurality of pad separation fences PF may be disposed between two expanded pad structures XPS adjacent to each other in the first horizontal direction (X direction) to secure an insulation distance therebetween. As illustrated in FIGS. 2C and 3, one sidewall of each of the conductive expanded pad 116P and the one or more expanded pad spacers 118S in the first horizontal direction (X direction) may be in contact with a sidewall of the pad separation fence PF.

As illustrated in FIG. 2A, a part of each of the plurality of pad separation fences PF may be buried in the buried insulating layer 124. A top surface of each of the plurality of pad separation fences PF may be at the same vertical level as a top surface of the buried insulating layer 124. The top surface of each of the plurality of pad separation fences PF may be at the first vertical level LV1, which is higher than the vertical level LVT of the main surface 102M of the substrate 102. The plurality of pad separation fences PF may include an oxide film, a nitride film, or a combination thereof.

A top surface of each of the gate dielectric layer 120, the buried insulating layer 124, the expanded pad structure XPS, and the plurality of pad separation fences PF may be covered with a buffer insulating layer 130. The buffer insulating layer 130 may include an oxide layer, a nitride layer, or a combination thereof.

As illustrated in FIG. 2C, the direct contact DC may be disposed on the active region AC. The plurality of bit lines BL may extend longitudinally in the second horizontal direction (Y direction) on the direct contact DC and the buffer insulating layer 130. Each of the plurality of bit lines BL may be disposed at a higher vertical level than a vertical level of the top surface of the conductive expanded pad 116P. The direct contact DC may be connected between the bit line BL and the active region AC. The direct contact DC may be spaced apart from the expanded pad structure XPS (FIG. 2B) in a horizontal direction, for example, in the first horizontal direction (X direction).

As illustrated in FIG. 2C, the pair of expanded pad structures XPS selected from among the plurality of expanded pad structures XPS may define the direct contact hole DCH. The direct contact DC may be disposed in the direct contact hole DCH. A sidewall of the expanded pad structure XPS exposed through the direct contact hole DCH may be covered with the contact insulating spacer DCS. As illustrated in FIG. 3, the expanded pad structure XPS adjacent to the direct contact DC in the first horizontal direction (X direction) may be spaced apart from the direct contact DC with the contact insulating spacer DCS disposed therebetween. The contact insulating spacer DCS may include an oxide layer, a nitride layer, or a combination thereof.

As illustrated in FIGS. 2A and 2C, the plurality of bit lines BL may be respectively covered with a plurality of insulating capping patterns 138. A plurality of conductive plugs 140P and a plurality of insulating fences 142 may each be alternately disposed in the second horizontal direction (Y direction) between a pair of adjacent bit lines BL among the plurality of bit lines BL. The plurality of insulating fences 142 may respectively fill a plurality of recesses 124R formed in the top surface of the buried insulating layer 124 and may each be disposed between each two of the plurality of conductive plugs 140P. Opposite sidewalls of each of the plurality of conductive plugs 140P may be covered with the plurality of insulating fences 142 in the second horizontal direction (Y direction). The plurality of conductive plugs 140P arranged in a line in the second horizontal direction (Y direction) may be insulated from each other by the plurality of insulating fences 142. The plurality of conductive plugs 140P may respectively constitute the plurality of buried contacts BC illustrated in FIG. 1. In the cross-sectional structure illustrated in FIG. 2B, although not shown, the buffer insulating layer 130 may be covered with the insulating fence 142.

As illustrated in FIG. 2C, the plurality of conductive plugs 140P may penetrate the buffer insulating layer 130 in the vertical direction (Z direction). The expanded pad structure XPS may include a part in contact with the conductive plug 140P. In some embodiments, the plurality of conductive plugs 140P may include parts in contact with each of the conductive expanded pad 116P and the one or more expanded pad spacers 118S of the expanded pad structure XPS. Each of the plurality of expanded pad structures XPS may be disposed between the substrate 102 and the conductive plug 140P. Each of the plurality of conductive plugs 140P may be electrically connected to one active region AC selected from among the plurality of active regions AC through the expanded pad structure XPS. Each of the plurality of bit lines BL may be electrically connected to the active region AC through the direct contact DC. One direct contact DC and a pair of conductive plugs 140P facing each other with the one direct contact DC disposed therebetween may be respectively electrically connected to different active regions AC from among the plurality of active regions AC. In some embodiments, the direct contact DC may be formed of Si, Ge, W, WN, Co, Ni, Al, Mo, Ru, Ti, TiN, Ta, TaN, Cu, or a combination thereof. For example, the direct contact DC may include an epitaxial silicon layer.

As illustrated in FIG. 2C, each of the plurality of bit lines BL may be spaced apart from the expanded pad structure XPS with the buffer insulating layer 130 disposed therebetween. The plurality of bit lines BL may include a lower conductive layer 132, an intermediate conductive layer 134, and an upper conductive layer 136 sequentially formed on the substrate 102. A top surface of the lower conductive layer 132 and a top surface of the direct contact DC may extend on the same plane. In FIGS. 2A and 2C, the plurality of bit lines BL are illustrated to have a triple-layer structure including the lower conductive layer 132, the intermediate conductive layer 134, and the upper conductive layer 136, but the present disclosure is not limited thereto. For example, the plurality of bit lines BL may be formed as a single layer, a double layer, or a plurality of stacked structures of four or more layers. In some embodiments, the lower conductive layer 132 may be formed of doped polysilicon. Each of the intermediate conductive layer 134 and the upper conductive layer 136 may be formed of TiN, TiSiN, W, tungsten silicide, or a combination thereof. For example, the intermediate conductive layer 134 may be formed of TiN and/or TiSiN, and the upper conductive layer 136 may be formed of W. The insulating capping pattern 138 may include a silicon nitride layer.

The plurality of conductive plugs 140P may have a pillar shape extending in the vertical direction (Z direction) along a space between each of the plurality of bit lines BL on the expanded pad structure XPS. A bottom surface of each of the plurality of conductive plugs 140P may be in contact with the expanded pad structure XPS. Each of the plurality of conductive plugs 140P may be spaced apart from the substrate 102 in the vertical direction (Z direction) with the expanded pad structure XPS disposed therebetween. The plurality of conductive plugs 140P may be formed of doped polysilicon, metal, conductive metal nitride, or a combination thereof.

Each of the plurality of insulating fences 142 may have a pillar shape extending in the vertical direction (Z direction) between each of the plurality of bit lines BL. The plurality of insulating fences 142 may include a silicon nitride layer.

As illustrated in FIGS. 2A and 2C, opposite sidewalls of each of the plurality of bit lines BL, the plurality of insulating capping patterns 138, and the plurality of direct contacts DC may be covered with a plurality of insulating spacers 146. The plurality of insulating spacers 146 may extend longitudinally in the second horizontal direction (Y direction) parallel to the plurality of bit lines BL on opposite sidewalls of each of the plurality of bit lines BL. The plurality of insulating spacers 146 may include an oxide layer, a nitride layer, an air spacer, or a combination thereof. As used herein, the term "air" may refer to a space including other gases that may be present in the atmosphere or during a manufacturing process. As illustrated in FIG. 2C, the insulating spacer 146 may contact the contact insulating spacer DCS in the direct contact hole DCH. Each of the plurality of conductive plugs 140P may be spaced apart from the bit line BL in the first horizontal direction (X direction) with the insulating spacer 146 disposed therebetween. As illustrated in FIG. 2A, each of the plurality of insulating fences 142 may be spaced apart from the bit line BL in the first horizontal direction (X direction) with the insulating spacer 146 disposed therebetween.

As illustrated in FIG. 2C, a metal silicide layer 172 and a conductive landing pad LP may be sequentially formed on the conductive plug 140P. The metal silicide layer 172 and the conductive landing pad LP may be disposed to vertically overlap the conductive plug 140P. Each of the plurality of metal silicide layers 172 may be disposed between the conductive plug 140P and the conductive landing pad LP, and may be spaced apart from the bit line BL with the insulating spacer 146 disposed therebetween. The metal silicide layer 172 may be formed of cobalt silicide, nickel silicide, or manganese silicide, but is not limited thereto.

Each of the plurality of conductive landing pads LP may be electrically connected to the conductive plug 140P through the metal silicide layer 172. Each of the plurality of conductive landing pads LP may extend from a space between each of the plurality of insulating capping patterns 138 to a space on each of the plurality of insulating capping patterns 138 to vertically overlap some of the plurality of bit lines BL. Each of the plurality of conductive landing pads LP may include a conductive barrier layer 174 and a conductive layer 176. The conductive barrier layer 174 may be formed of Ti, TiN, or a combination thereof. The conductive layer 176 may be formed of metal, metal nitride, conductive polysilicon, or a combination thereof. For example, the conductive layer 176 may include tungsten (W).

As illustrated in FIG. 1, the plurality of conductive landing pads LP may have a plurality of island pattern shapes in a plan view. For example, the plurality of conductive landing pads LP may have a plurality of circular pattern shapes in a plan view. As illustrated in FIG. 2C, the plurality of conductive landing pads LP may be electrically insulated from each other by an insulating layer 180 filling an insulating space 180S therearound. The insulating layer 180 may include a silicon nitride layer, a silicon oxide layer, or a combination thereof.

The integrated circuit device 100 illustrated in FIGS. 2A to 2C and 3 may include the plurality of expanded pad structures XPS disposed between the active region AC and the conductive plug 140P and including parts respectively contacting the active region AC and the conductive plug 140P. Each of the plurality of expanded pad structures XPS may include a conductive expanded pad 116P and one or more expanded pad spacers 118S covering opposite sidewalls of the conductive expanded pad 116P in the second horizontal direction (Y direction). The conductive expanded pad 116P may be simultaneously formed during an etching process for forming a plurality of word line trenches WT formed in the substrate 102. According to a high integration of the integrated circuit device 100, an aspect ratio of each of the plurality of word line trenches WT may be relatively increased. Accordingly, after the etching process for forming the plurality of word line trenches WT is performed, an entrance critical dimension (CD) of each of the plurality of word line trenches WT may be greater than that of a bottom CD. In this case, the width of the conductive expanded pad 116P in the second horizontal direction (Y direction) may be relatively reduced because the conductive expanded pad 116P remaining on the substrate 102 between each of the plurality of word line trenches WT is also consumed during the etching process for forming the word line trench WT. As a result, a contact area between the conductive expanded pad 116P and the conductive plug 140P formed thereon may not be sufficient. According to the present disclosure, each of the plurality of expanded pad structures XPS may further include one or more expanded pad spacers 118S covering opposite sidewalls of the conductive expanded pad 116P in the second horizontal direction (Y direction). Therefore, the contact area in the conductive expanded pad 116P that may be insufficient may be compensated for by the one or more expanded pad spacers 118S. Accordingly, a sufficient contact area may be secured between the expanded pad structure XPS and the conductive plug 140P, and the reliability of the integrated circuit device 100 may be improved.

Figure 4:
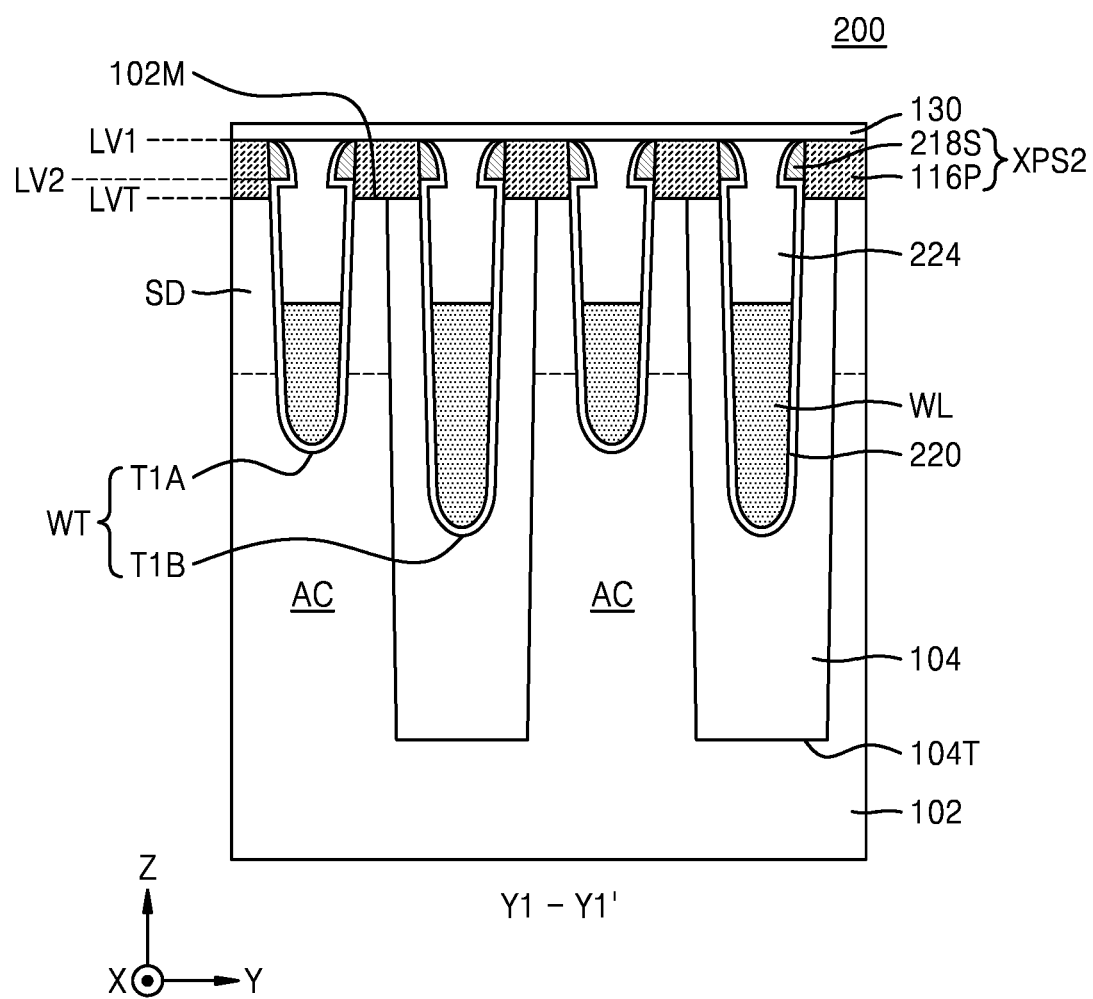
FIG. 4 is a cross-sectional view illustrating an integrated circuit device according to some embodiments.

FIG. 4 is a cross-sectional view illustrating an integrated circuit device 200 according to some embodiments. FIG. 4 illustrates some components of a part corresponding to the cross section taken along the line Y1-Y1' of FIG. 1. In FIG. 4, the same reference numerals as used in FIGS. 2A to 2C denote the same members, and redundant descriptions thereof are omitted here.

Referring to FIG. 4, the integrated circuit device 200 has substantially the same configuration as that of the integrated circuit device 100 described with reference to FIGS. 1, 2A to 2C, and 3. The integrated circuit device 200 includes a plurality of expanded pad structures XPS2 disposed on the main surface 102M of the substrate 102. Each of the plurality of expanded pad structures XPS2 may include a part in contact with one active region AC selected from among the plurality of active regions AC. Each of the plurality of expanded pad structures XPS2 may include the conductive expanded pad 116P and one or more expanded pad spacers 218S covering opposite sidewalls of the conductive expanded pad 116P in the second horizontal direction (Y direction).

The conductive expanded pad 116P may have the same configuration as described with reference to FIGS. 2A to 2C and 3. The one or more expanded pad spacers 218S may have substantially the same configuration as that of the one or more expanded pad spacers 118S described with reference to FIGS. 2A to 2C and 3. The one or more expanded pad spacers 218S may protrude farther toward the word line trench WT in the second horizontal direction (Y direction) than an inner sidewall of the word line trench WT adjacent to the conductive expanded pad 116P among inner sidewalls of each of the pair of word line trenches WT on both sides of the conductive expanded pad 116P. For example, the one or more expanded pad spacers 218S may protrude beyond the inner sidewall of the word line trench WT in the second horizontal direction (Y direction) such that the one or more expanded pad spacers 218S vertically overlaps (i.e., overlaps in the Z direction) a portion of the word line WL in the word line trench WT. However, a bottom surface of the one or more expanded pad spacers 218S may be at a second vertical level LV2, which is higher than the vertical level LVT of the main surface 102M of the substrate 102 and is lower than the first vertical level LV1. For example, the vertical level LVT of the main surface 102M of the substrate 102 may be a vertical level of a bottom surface of the conductive expanded pad 116P, and the first vertical level LV1 may be a vertical level of a top surface of the conductive expanded pad 116P.

A gate dielectric layer 220 and a buried insulating layer 224 included in the integrated circuit device 200 may have substantially the same configurations as those of the gate dielectric layer 120 and the buried insulating film 124 described with reference to FIGS. 2A and 2B. However, the buried insulating layer 224 may include an upper portion disposed between a pair of the one or more expanded pad spacers 218S adjacent to each other having a width in the second horizontal direction (Y direction) that is smaller than a width of a lower portion thereof at the vertical level LVT of the main surface 102M of the substrate 102. The upper portion of the buried insulating layer 224 disposed between the pair of the one or more expanded pad spacers 218S may have a width that changes when moving in the vertical direction (Z direction) from the second vertical level LV2 to the first vertical level LV1. For example, the width of the upper portion of the buried insulating layer 124 disposed between the adjacent pair of the one or more expanded pad spacers 218S may increase when moving in the vertical direction (Z direction) from the second vertical level LV2 to the first vertical level LV1. However, the present disclosure is not limited thereto. The gate dielectric layer 220 may include a part extending in the second horizontal direction (Y direction) at the second vertical level LV2 (e.g., the vertical level adjacent to the bottom surface of the one or more expanded pad spacers 218S) or at the vertical level higher than the main surface 102M of the substrate 102.

Figure 5:
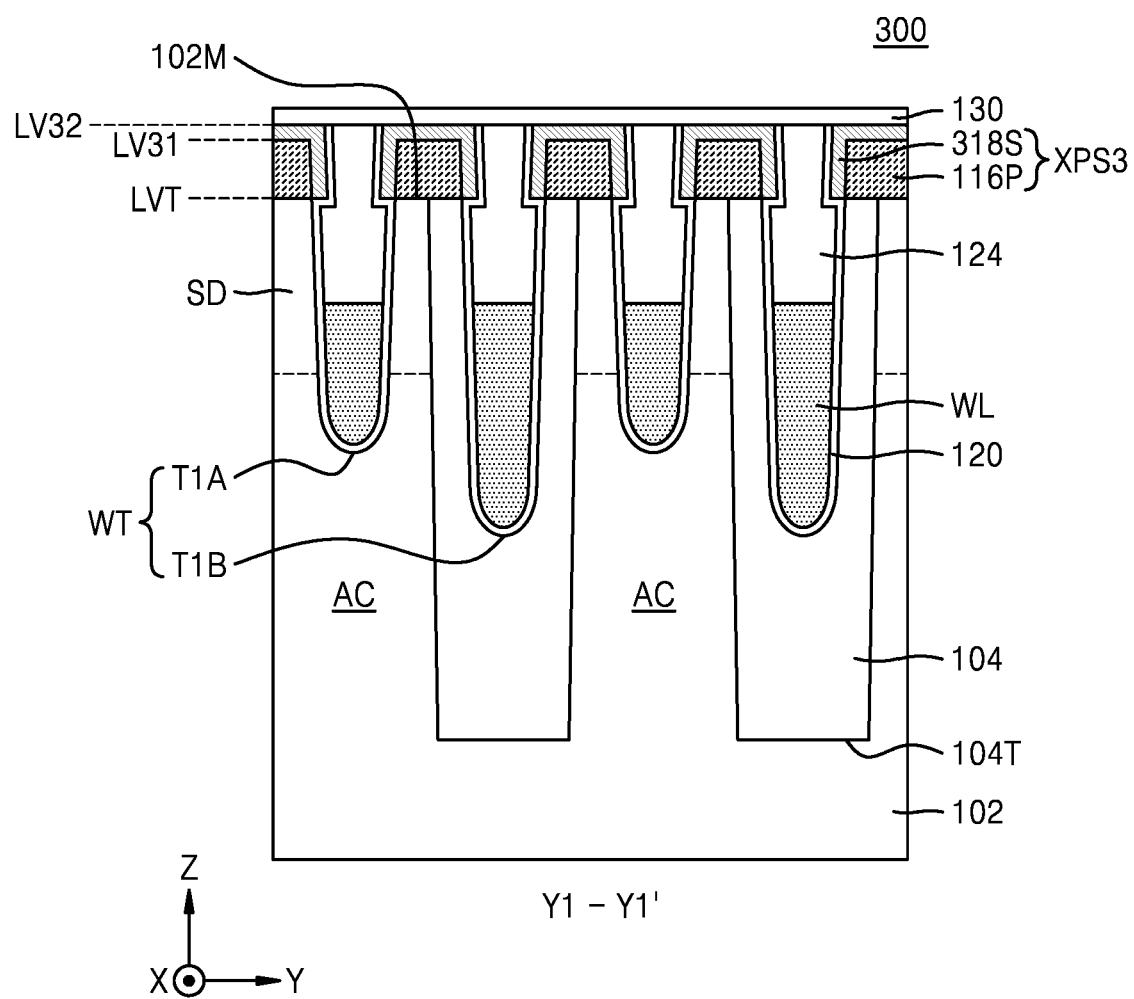
FIG. 5 is a cross-sectional view illustrating an integrated circuit device according to some embodiments.

FIG. 5 is a cross-sectional view illustrating an integrated circuit device 300 according to some embodiments. FIG. 5 illustrates some components of a part corresponding to the cross section taken along the line Y1-Y1' of FIG. 1. In FIG. 5, the same reference numerals as used in FIGS. 2A to 2C denote the same members, and redundant descriptions thereof are omitted here.

Referring to FIG. 5, the integrated circuit device 300 has substantially the same configuration as that of the integrated circuit device 100 described with reference to FIGS. 1, 2A to 2C, and 3. The integrated circuit device 300 includes a plurality of expanded pad structures XPS3 disposed on the main surface 102M of the substrate 102. Each of the plurality of expanded pad structures XPS3 may have substantially the same configuration as that of the expanded pad structure XPS described with reference to FIGS. 2A to 2C and 3. Each of the plurality of expanded pad structures XPS3 may include a part in contact with one active region AC selected from among the plurality of active regions AC. Each of the plurality of expanded pad structures XPS3 may include the conductive expanded pad 116P and one or more expanded pad spacers 318S. However, the one or more expanded pad spacers 318S may cover opposite sidewalls of the conductive expanded pad 116P in the second horizontal direction (Y direction) and a top surface of the conductive expanded pad 116P in the vertical direction (Z direction). The one or more expanded pad spacers 318S may have substantially the same configuration as that of the one or more expanded pad spacers 118S described with reference to FIGS. 2A to 2C and 3. In some embodiments, the one or more expanded pad spacers 318S may be only one expanded pad spacer 318S, the one expanded pad spacer 318S covering the opposite sidewalls of the conductive expanded pad 116P in the second horizontal direction (Y direction) and the top surface of the conductive expanded pad 116P in the vertical direction (Z direction). The one or more expanded pad spacers 318S may protrude farther toward the word line trench WT in the second horizontal direction (Y direction) than an inner sidewall of the word line trench WT adjacent to the conductive expanded pad 116P among inner sidewalls of each of the pair of word line trenches WT on both sides of the conductive expanded pad 116P. For example, the one or more expanded pad spacers 318S may protrude beyond the inner sidewall of the word line trench WT in the second horizontal direction (Y direction) such that the one more expanded pad spacers 318S vertically overlaps (i.e., overlaps in the Z direction) a portion of the word line WL in the word line trench WT. However, a top surface of the one or more expanded pad spacers 318S may form the uppermost surface of the expanded pad structure XPS3.

The uppermost surface of the conductive expanded pad 116P may be at a first vertical level LV31 higher than the vertical level LVT of the main surface 102M of the substrate 102. The uppermost surface of each of the buried insulating layer 124, the gate dielectric layer 120, and the expanded pad structure XPS3 may be at a second vertical level LV32 higher than the first vertical level LV31. The uppermost surface of each of the gate dielectric layer 120, the buried insulating layer 124, and the one or more expanded pad spacers 318S may be at the same vertical level (e.g., the second vertical level LV32). The uppermost surface of the conductive expanded pad 116P may be closer to the substrate 102 than the uppermost surface of each of the buried insulating layer 124 and the gate dielectric layer 120. The buried insulating layer 124 may have an upper portion disposed between the pair of expanded pad structures XPS selected from among the plurality of expanded pad structures XPS having a width that remains the same when moving in the vertical direction (Z direction) from the vertical level LVT of the main surface 102M of the substrate 102 to the second vertical level LV32.

Figure 6:
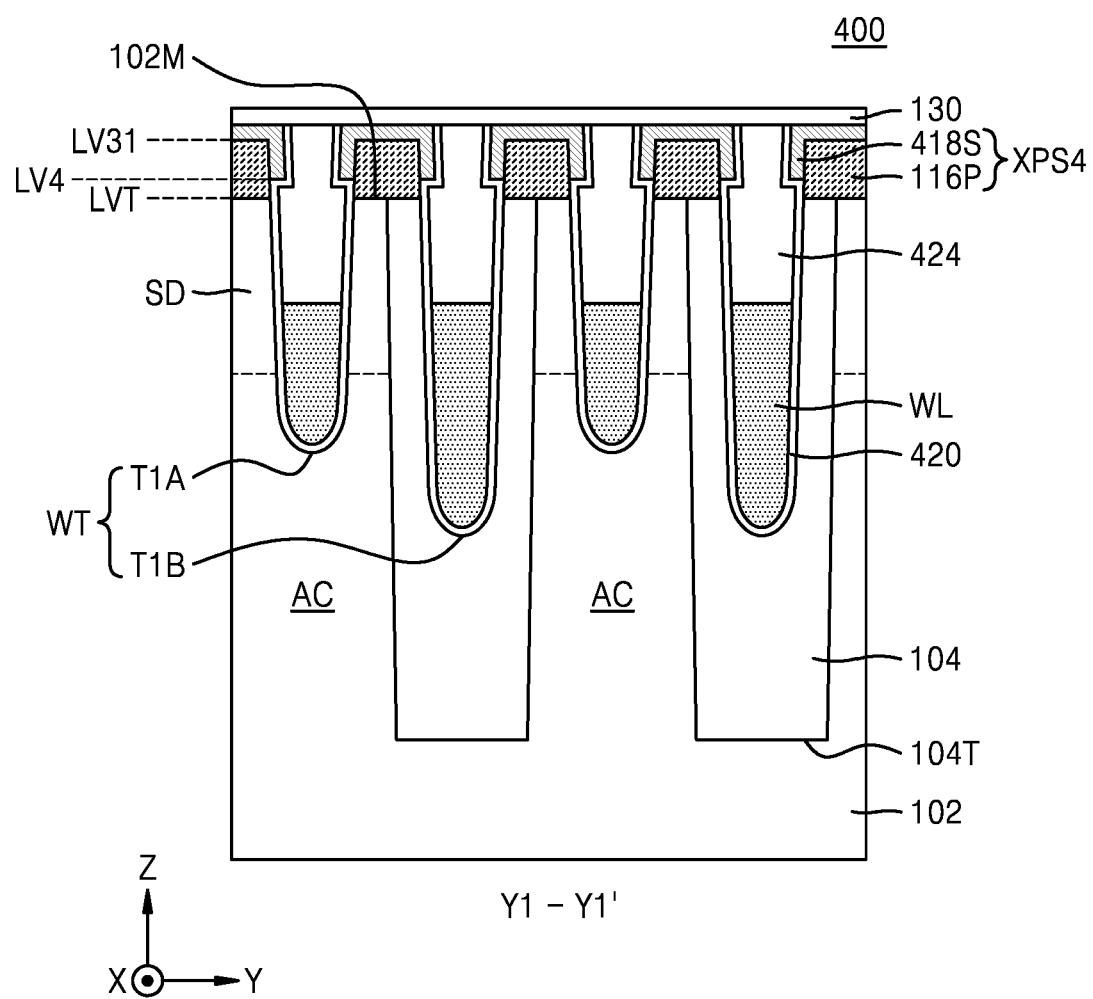
FIG. 6 is a cross-sectional view illustrating an integrated circuit device according to some embodiments.

FIG. 6 is a cross-sectional view illustrating an integrated circuit device 400 according to some embodiments. FIG. 6 illustrates some components of a part corresponding to the cross section taken along the line Y1-Y1' of FIG. 1. In FIG. 6, the same reference numerals as used in FIGS. 2A to 2C denote the same members, and redundant descriptions thereof are omitted here.

Referring to FIG. 6, the integrated circuit device 400 has substantially the same configuration as that of the integrated circuit device 100 described with reference to FIGS. 1, 2A to 2C, and 3. The integrated circuit device 400 includes a plurality of expanded pad structures XPS4 disposed on the main surface 102M of the substrate 102. Each of the plurality of expanded pad structures XPS4 may include a portion in contact with one active region AC selected from among the plurality of active regions AC. Each of the plurality of expanded pad structures XPS4 may include the conductive expanded pad 116P and one or more expanded pad spacers 418S. The one or more expanded pad spacers 418S may cover opposite sidewalls of the conductive expanded pad 116P in the second horizontal direction (Y direction).

The conductive expanded pad 116P may have the same configuration as described with reference to FIGS. 2A to 2C and 3. The one or more expanded pad spacers 418S may have substantially the same configuration as that of the one or more expanded pad spacers 318S described with reference to FIG. 5. In some embodiments, the one or more expanded pad spacers 418S may be only one expanded pad spacer 418S, the one expanded pad spacer 418S covering the opposite sidewalls of the conductive expanded pad 116P in the second horizontal direction (Y direction) and a top surface of the conductive expanded pad 116P in the vertical direction (Z direction). The expanded pad spacer 418S may protrude farther toward the word line trench WT in the second horizontal direction (Y direction) than an inner sidewall of the word line trench WT adjacent to the conductive expanded pad 116P among inner sidewalls of each of the pair of word line trenches WT on both sides of the conductive expanded pad 116P. For example, the one or more expanded pad spacers 418S may protrude beyond the inner sidewall of the word line trench WT in the second horizontal direction (Y direction) such that the one or more expanded pad spacers 418S vertically overlaps (i.e., overlaps in the Z direction) a portion of the word line WL in the word line trench WT. However, a bottom surface of the one or more expanded pad spacers 418S may be at a vertical level LV4 higher than the vertical level LVT of the main surface 102M of the substrate 102 and lower than the first vertical level LV31.

The gate dielectric layer 420 and the buried insulating layer 424 included in the integrated circuit device 400 may have substantially the same configuration as those described for the gate dielectric layer 120 and the buried insulating layer 124 with reference to FIGS. 2A and 2B. However, the buried insulating layer 424 may include an upper portion having a width in the second horizontal direction (Y direction) that is smaller than a lower portion thereof at the vertical level LVT of the main surface 102M of the substrate 102. The width of the upper portion of the buried insulating layer 424 may remain the same when moving in the vertical direction (Z direction) from the vertical level LV4 to the first vertical level LV31. The gate dielectric layer 420 may include a part extending in the second horizontal direction (Y direction) at the vertical level LV4 (e.g., a vertical level adjacent to the bottom surface of the one or more expanded pad spacers 418S) or at the vertical level higher than the main surface 102M of the substrate 102.

Figure 7A:
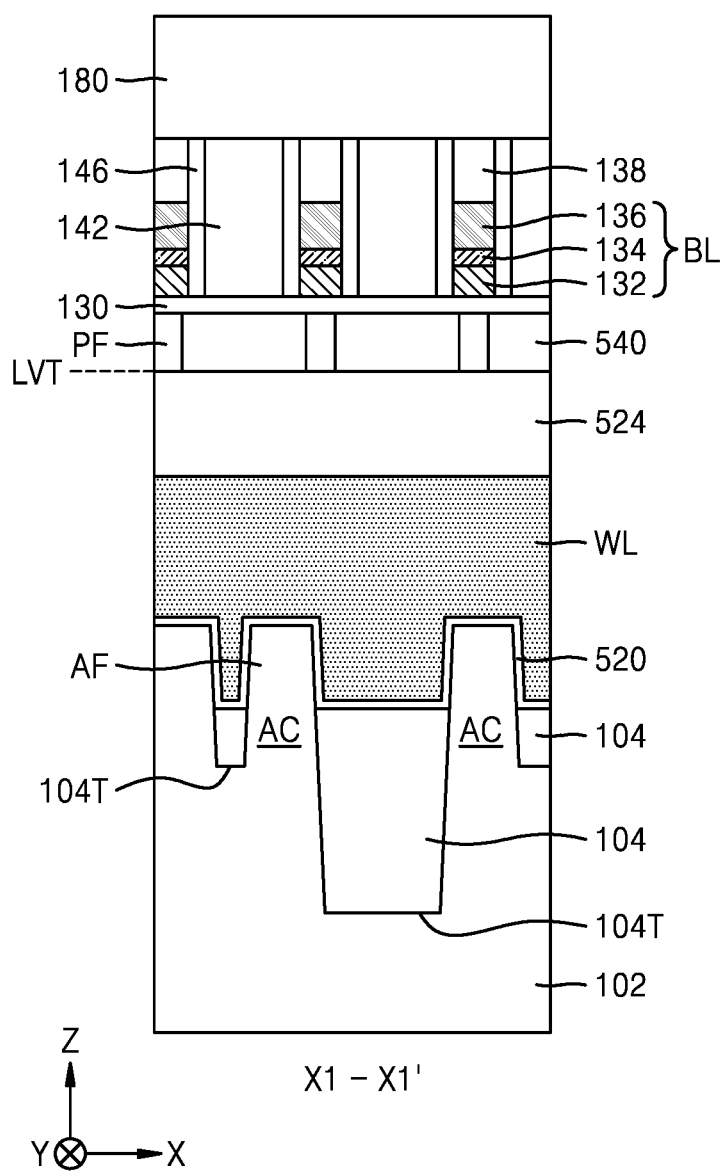
FIGS. 7A and 7B are cross-sectional views illustrating an integrated circuit device according to some embodiments.
Figure 7B:
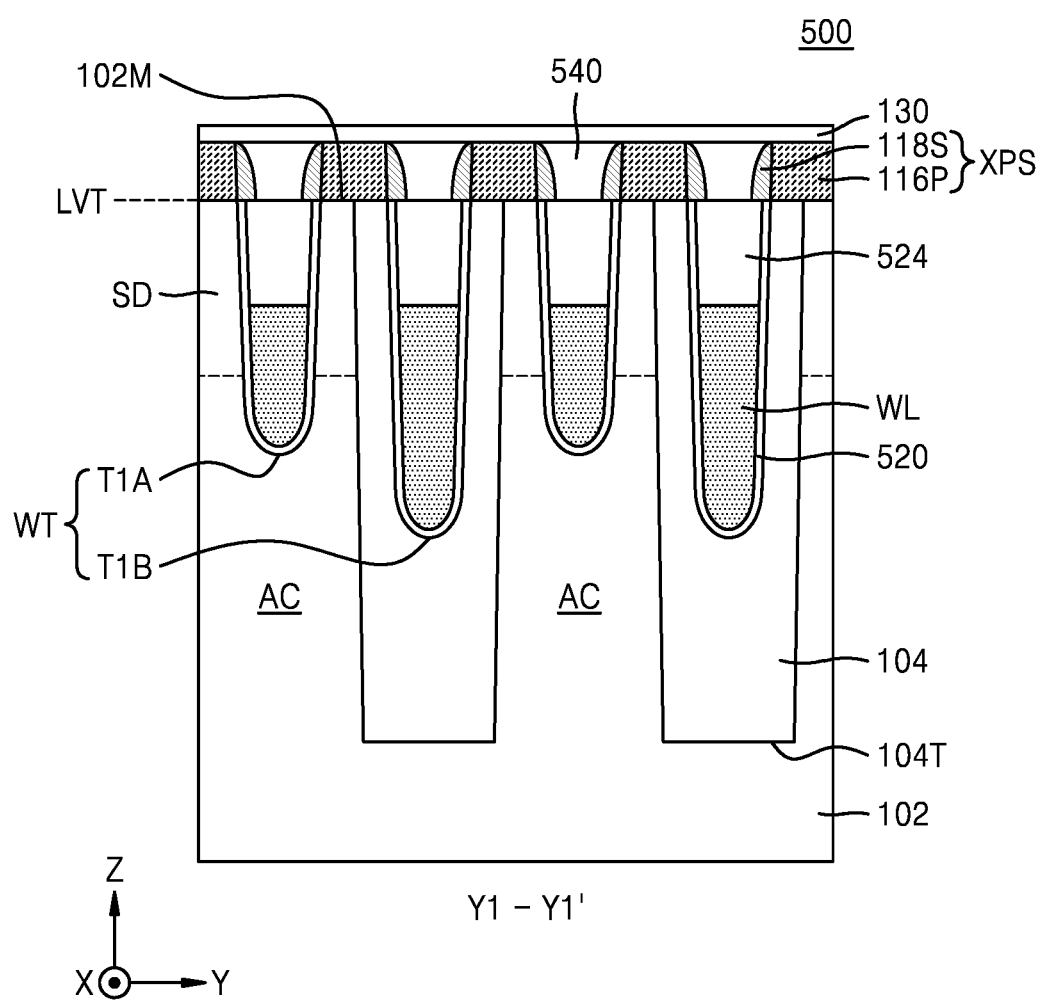

FIGS. 7A and 7B are cross-sectional views illustrating an integrated circuit device 500 according to some embodiments. FIG. 7A illustrates some components of a part corresponding to the cross section taken along the line X1-X1' of FIG. 1, and FIG. 7B illustrates some components of a part corresponding to the cross section taken along the line Y1-Y1' of FIG. 1. In FIGS. 7A and 7B, the same reference numerals as used in FIGS. 2A to 2C and 3 denote the same members, and redundant descriptions thereof are omitted here.

Referring to FIGS. 7A and 7B, the integrated circuit device 500 has substantially the same configuration as that of the integrated circuit device 100 described with reference to FIGS. 1, 2A to 2C, and 3. The integrated circuit device 500 may include the plurality of expanded pad structures XPS disposed on the main surface 102M of the substrate 102. Each of the plurality of expanded pad structures XPS may include the conductive expanded pad 116P and the one or more expanded pad spacers 118S covering opposite sidewalls of the conductive expanded pad 116P in the second horizontal direction (Y direction). However, the integrated circuit device 500 may include a gate dielectric layer 520 surrounding the word line WL in the word line trench WT, a buried insulating layer 524 covering a top surface of the word line WL in the word line trench WT, and a gap-fill insulating layer 540 covering a top surface of the buried insulating layer 524. The gate dielectric layer 520 may surround the word line WL and the buried insulating layer 524 in the word line trench WT.

The gate dielectric layer 520 and the buried insulating layer 524 may have substantially the same configurations as those of the gate dielectric layer 120 and the buried insulating layer 124 described with reference to FIGS. 2A and 2B, respectively. However, in the integrated circuit device 500, the uppermost surface of each of the gate dielectric layer 520 and the buried insulating layer 524 may be closer to the substrate 102 than the uppermost surface of the expanded pad structure XPS. In some embodiments, a vertical level of the uppermost surface of each of the gate dielectric layer 520 and the buried insulating layer 524 may be the same as the vertical level LVT of the main surface 102M of the substrate 102 (e.g., a vertical level of a bottom surface of each of the conductive expanded pad 116P and the one or more expanded pad spacers 118S). The top surface of each of the gate dielectric layer 520 and the buried insulating layer 524 may contact the bottom surface of the one or more expanded pad spacers 118S.

The gap-fill insulating layer 540 may contact each of the one or more expanded pad spacers 118S and the top surface of the buried insulating layer 524. The uppermost surface of the gap-fill insulating layer 540 may be at the same vertical level as the uppermost surface of the expanded pad structure XPS. Opposite sidewalls of the gap-fill insulating layer 540 may contact in the second horizontal direction (Y direction) a pair of the one or more expanded pad spacers 118S included in a pair of expanded pad structures XPS adjacent to each other among the plurality of expanded pad structures XPS. In some embodiments, the gap-fill insulating layer 540 may include an oxide layer, a nitride layer, or a combination thereof.

As illustrated in FIG. 7A, the plurality of pad separation fences PF may be disposed at positions spaced apart from each other on the substrate 102. Similar to that described with reference to FIG. 3, each of the plurality of pad separation fences PF may have a planar shape extending longitudinally in the second horizontal direction (Y direction), and may be disposed between two expanded pad structures XPS adjacent to each other in the first horizontal direction (X direction) to secure an insulation distance therebetween. Each of the plurality of pad separation fences PF may have a sidewall in contact with the gap-fill insulating layer 540 and a bottom surface in contact with the buried insulating layer 524. Similar to that described with reference to FIG. 3, one sidewall of each of the conductive expanded pad 116P and the one or more expanded pad spacers 118S in the first horizontal direction (X direction) may contact the sidewall of the pad separation fence PF. A top surface of each of the gap-fill insulating layer 540, the expanded pad structure XPS, and the plurality of pad separation fences PF may be covered with the buffer insulating layer 130. A more detailed configuration of each of the expanded pad structure XPS, the plurality of pad separation fences PF, and the buffer insulating layer 130 is the same as described with reference to FIGS. 2A, 2C, and 3.

Figure 8:
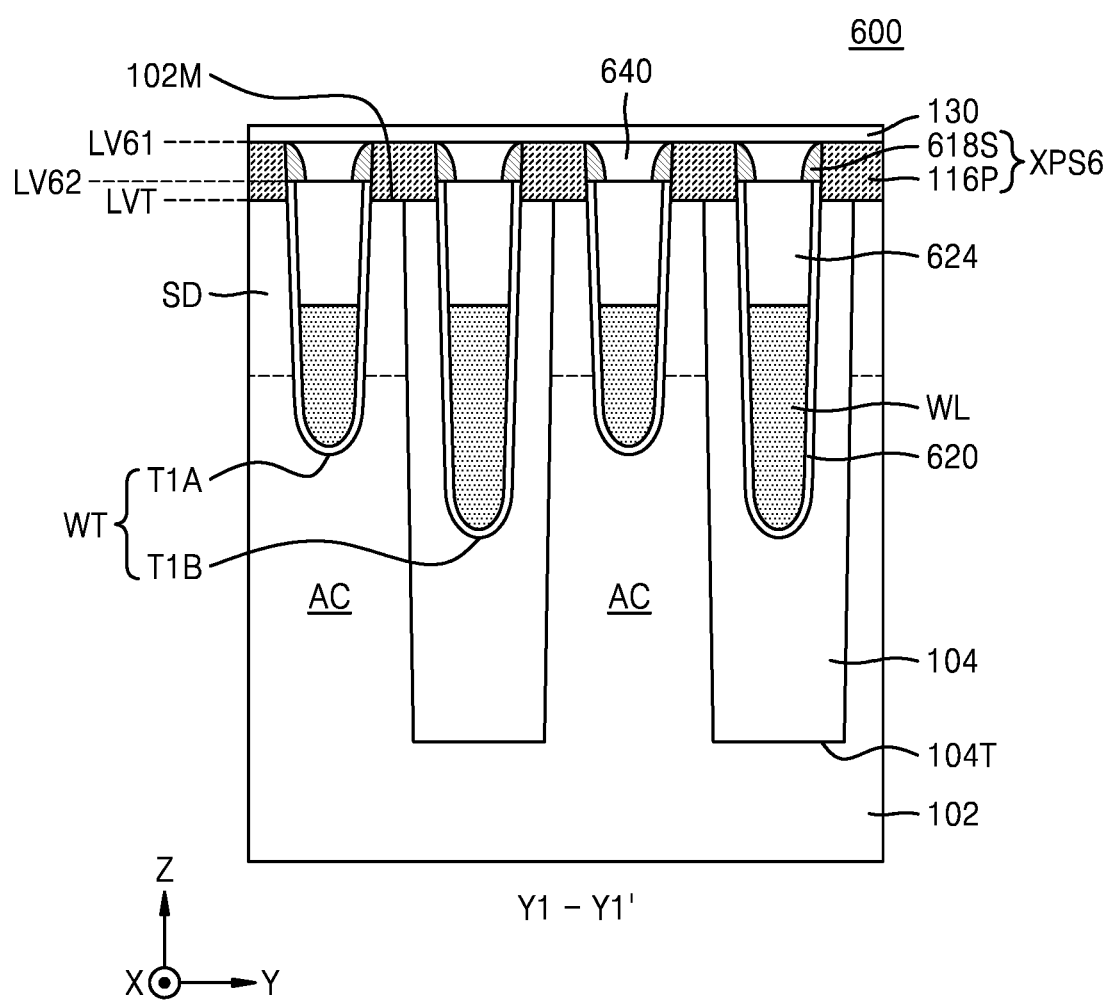
FIG. 8 is a cross-sectional view illustrating an integrated circuit device according to some embodiments.

FIG. 8 is a cross-sectional view illustrating an integrated circuit device 600 according to some embodiments. FIG. 8 illustrates some components of a part corresponding to the cross section taken along the line Y1-Y1' of FIG. 1. In FIG. 8, the same reference numerals as used in FIGS. 2A to 2C and FIGS. 7A and 7B denote the same members, and redundant descriptions thereof are omitted here.

Referring to FIG. 8, the integrated circuit device 600 has substantially the same configuration as that of the integrated circuit device 500 described with reference to FIGS. 7A and 7B. However, the integrated circuit device 600 includes a plurality of expanded pad structures XPS6 disposed on the main surface 102M of the substrate 102. Each of the plurality of expanded pad structures XPS6 may include a part in contact with one active region AC selected from among the plurality of active regions AC. Each of the plurality of expanded pad structures XPS6 may include the conductive expanded pad 116P and one or more expanded pad spacers 618S. The one or more expanded pad spacers 618S may cover opposite sidewalls of the conductive expanded pad 116P in the second horizontal direction (Y direction).

The conductive expanded pad 116P may have the same configuration as described with reference to FIGS. 2A to 2C and 3. The one or more expanded pad spacers 618S may have substantially the same configuration as that of the one or more expanded pad spacers 218S with reference to FIG. 4. The one or more expanded pad spacers 618S may further protrude toward the word line trench WT in the second horizontal direction (Y direction) than an inner sidewall of the word line trench WT adjacent to the conductive expanded pad 116P among inner sidewalls of each of the pair of word line trenches WT on both sides of the conductive expanded pad 116P. For example, the one or more expanded pad spacers 618S may protrude beyond the inner sidewall of the word line trench WT in the second horizontal direction (Y direction) such that the one or more expanded pad spacers 618S vertically overlaps (i.e., overlaps in the Z direction) a portion of the word line WL in the word line trench WT. However, a bottom surface of the one or more expanded pad spacers 618S may be at a second vertical level LV62 which is higher than the vertical level LVT of the main surface 102M of the substrate 102 and is lower than a first vertical level LV61. For example, the vertical level LVT of the main surface 102M of the substrate 102 may be a vertical level of a bottom surface of the conductive expanded pad 116P, and the first vertical level LV61 may be a vertical level of a top surface of the conductive expanded pad 116P.

A gate dielectric layer 620 and a buried insulating layer 624 included in the integrated circuit device 600 may have substantially the same configurations as those of the gate dielectric layer 520 and the buried insulating layer 524 described with reference to FIGS. 7A and 7B. However, the uppermost surface of each of the gate dielectric layer 620 and the buried insulating layer 624 may be higher than the vertical level LVT of the main surface 102M of the substrate 102. A vertical level of the uppermost surface of each of the gate dielectric layer 620 and the buried insulating layer 624 may be the same as the second vertical level LV62. A top surface of each of the gate dielectric layer 620 and the buried insulating layer 624 may contact the bottom surface of the one or more expanded pad spacers 618S. The integrated circuit device 600 may include a gap-fill insulating layer 640 covering a top surface of the buried insulating layer 624. The gap-fill insulating layer 640 may contact each of the one or more expanded pad spacers 618S and the top surface of the buried insulating layer 624. The uppermost surface of the gap-fill insulating layer 640 and the uppermost surface of the expanded pad structure XPS6 may be at the same vertical level, that is, the first vertical level LV61. Opposite sidewalls of the gap-fill insulating layer 640 may contact in the second horizontal direction (Y direction) a pair of the one or more expanded pad spacers 618S included in a pair of expanded pad structures XPS6 adjacent to each other among the plurality of expanded pad structures XPS6. In some embodiments, the gap-fill insulating layer 640 may include an oxide layer, a nitride layer, or a combination thereof.

Figure 9:
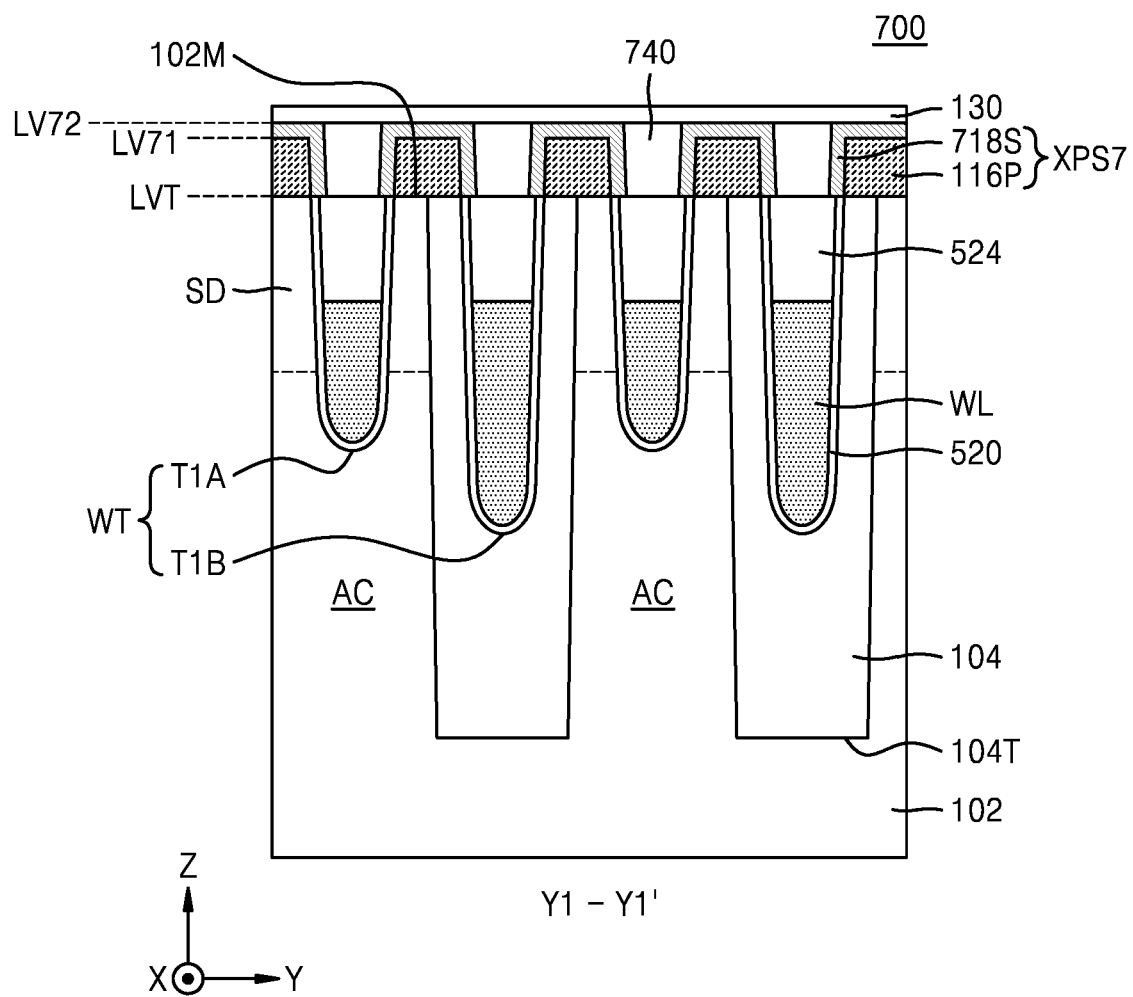
FIG. 9 is a cross-sectional view illustrating an integrated circuit device according to some embodiments.

FIG. 9 is a cross-sectional view illustrating an integrated circuit device 700 according to some embodiments. FIG. 9 illustrates some components of a part corresponding to the cross section taken along the line Y1-Y1' of FIG. 1. In FIG. 9, the same reference numerals as used in FIGS. 2A to 2C and FIGS. 7A and 7B denote the same members, and redundant descriptions thereof are omitted here.

Referring to FIG. 9, the integrated circuit device 700 has substantially the same configuration as that of the integrated circuit device 500 described with reference to FIGS. 7A and 7B. The integrated circuit device 700 includes a plurality of expanded pad structures XPS7 disposed on the main surface 102M of the substrate 102. The plurality of expanded pad structures XPS7 may have substantially the same configurations as those of the expanded pad structure XPS3 described with reference to FIG. 5. Each of the plurality of expanded pad structures XPS7 may include a portion in contact with one active region AC selected from among the plurality of active regions AC. However, each of the plurality of expanded pad structures XPS7 may include the conductive expanded pad 116P and one or more expanded pad spacers 718S. The one or more expanded pad spacers 718S may cover opposite sidewalls of the conductive expanded pad 116P in the second horizontal direction (Y direction) and a top surface of the conductive expanded pad 116P in the vertical direction (Z direction). The one or more expanded pad spacers 718S may have substantially the same configuration as that of the one or more expanded pad spacers 318S described with reference to FIG. 5. In some embodiments, the one or more expanded pad spacers 718S may be only one expanded pad spacer 718S, the one expanded pad spacer 718S covering the opposite sidewalls of the conductive expanded pad 116P in the second horizontal direction (Y direction) and the top surface of the conductive expanded pad 116P in the vertical direction (Z direction). The one or more expanded pad spacers 718S may protrude farther toward the word line trench WT in the second horizontal direction (Y direction) than an inner sidewall of the word line trench WT adjacent to the conductive expanded pad 116P among inner sidewalls of each of the pair of word line trenches WT on both sides of the conductive expanded pad 116P. For example, the one or more expanded pad spacers 718S may protrude beyond the inner sidewall of the word line trench WT in the second horizontal direction (Y direction) such that the one or more expanded pad spacers 718S vertically overlaps (i.e., overlaps in the Z direction) a portion of the word line WL in the word line trench WT. A top surface of the one or more expanded pad spacers 718S may form the uppermost surface of the expanded pad structure XPS7.

The uppermost surface of the conductive expanded pad 116P may be at a first vertical level LV71 higher than the vertical level LVT of the main surface 102M of the substrate 102. A vertical level of a top surface of each of the buried insulating layer 524 and the gate dielectric layer 520 may be the same as the vertical level LVT of the main surface 102M of the substrate 102 (e.g., a vertical level of a bottom surface of the conductive expanded pad 116P). The first vertical level LV71 (e.g., a vertical level of the top surface of the conductive expanded pad 116P) may be lower than a second vertical level LV72 (e.g., a vertical level of the uppermost surface of the one or more expanded pad spacers 718S).

The integrated circuit device 700 may include the gate dielectric layer 520 surrounding the word line WL in the word line trench WT, the buried insulating layer 524 covering a top surface of the word line WL in the word line trench WT, and a gap-fill insulating layer 740 covering a top surface of the buried insulating layer 524. The gate dielectric layer 520 may surround the word line WL and the buried insulating layer 524 in the word line trench WT. The gate dielectric layer 520 and the buried insulating layer 524 may have substantially the same configurations as described with reference to FIGS. 7A and 7B, respectively. A vertical level of the uppermost surface of each of the gate dielectric layer 520 and the buried insulating layer 524 may be the same as the vertical level LVT of the main surface 102M of the substrate 102 (e.g., a vertical level of a bottom surface of each of the conductive expanded pad 116P and the one or more expanded pad spacers 718S). A top surface of the gate dielectric layer 520 may contact a bottom surface of the one or more expanded pad spacers 718S.

The gap-fill insulating layer 740 may contact each of the one or more expanded pad spacers 718S and the top surface of the buried insulating layer 524. The uppermost surface of the gap-fill insulating layer 740 may be at the same vertical level as the uppermost surface of the expanded pad structure XPS7. Opposite sidewalls of the gap-fill insulating layer 740 may contact in the second horizontal direction (Y direction) a pair of the one or more expanded pad spacers 718S included in a pair of expanded pad structures XPS7 adjacent to each other among the plurality of expanded pad structures XPS7. In some embodiments, the gap-fill insulating layer 740 may include an oxide layer, a nitride layer, or a combination thereof.

Figure 10:
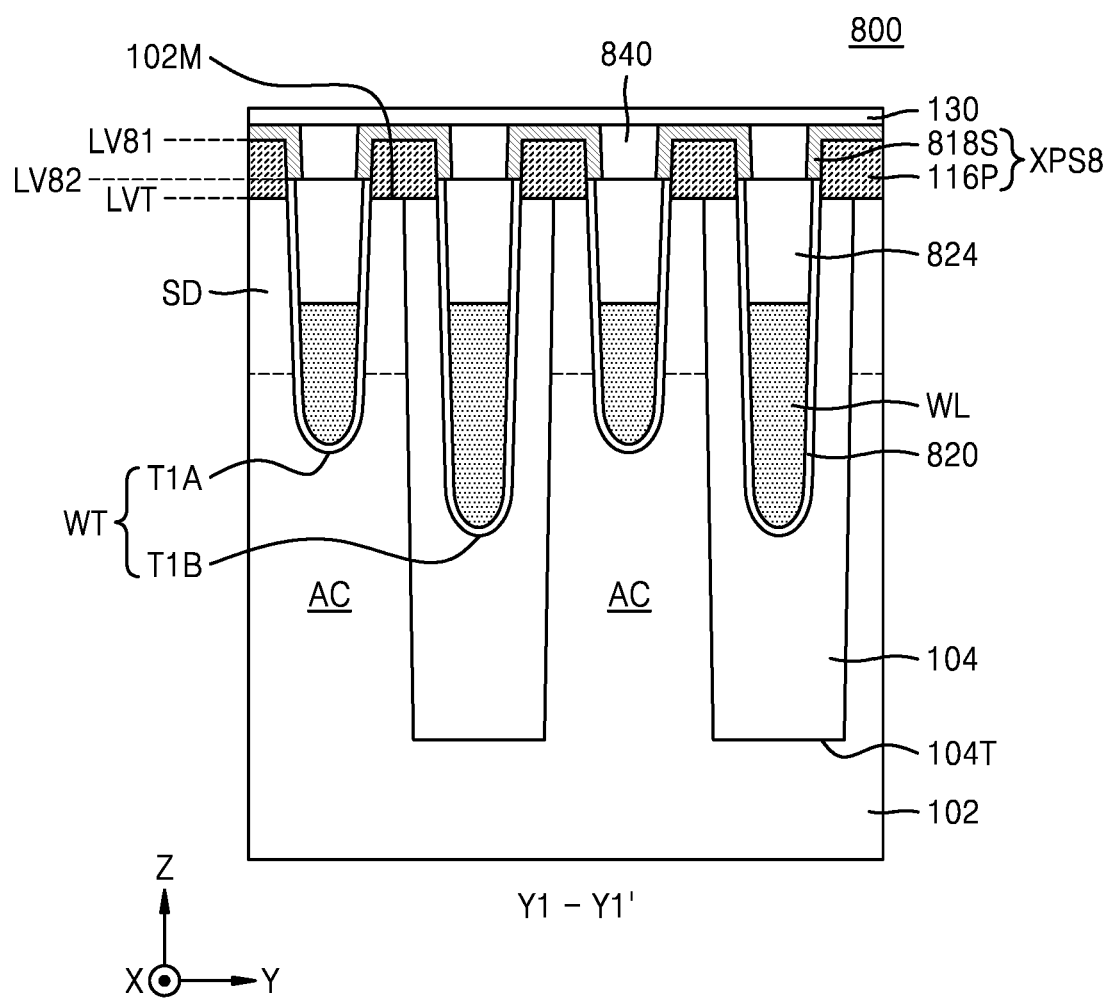
FIG. 10 is a cross-sectional view illustrating an integrated circuit device according to some embodiments.

FIG. 10 is a cross-sectional view illustrating an integrated circuit device 800 according to some embodiments. FIG. 10 illustrates some components of a part corresponding to the cross section taken along the line Y1-Y1' of FIG. 1. In FIG. 10, the same reference numerals as used in FIGS. 2A to 2C and FIGS. 7A and 7B denote the same members, and redundant descriptions thereof are omitted here.

Referring to FIG. 10, the integrated circuit device 800 has substantially the same configuration as that of the integrated circuit device 500 described with reference to FIGS. 7A and 7B. The integrated circuit device 800 includes a plurality of expanded pad structures XPS8 disposed on the main surface 102M of the substrate 102. Each of the plurality of expanded pad structures XPS8 may include a portion in contact with one active region AC selected from among the plurality of active regions AC. Each of the plurality of expanded pad structures XPS8 may include the conductive expanded pad 116P and one or more expanded pad spacers 818S. The one or more expanded pad spacers 818S may cover opposite sidewalls of the conductive expanded pad 116P in the second horizontal direction (Y direction) and a top surface of the conductive expanded pad 116P in the vertical direction (Z direction).

The conductive expanded pad 116P may have the same configuration as described with reference to FIGS. 2A to 2C and 3. The one or more expanded pad spacers 818S may have substantially the same configuration as that of the expanded pad spacer 418S described with reference to FIG. 6. In some embodiments, the one or more expanded pad spacers 818S may be only one expanded pad spacer 818S, the one expanded pad spacer 818S covering the opposite sidewalls of the conductive expanded pad 116P in the second horizontal direction (Y direction) and the top surface of the conductive expanded pad 116P in the vertical direction (Z direction). The one or more expanded pad spacers 818S may further protrude toward the word line trench WT in the second horizontal direction (Y direction) than an inner sidewall of the word line trench WT adjacent to the conductive expanded pad 116P among inner sidewalls of each of the pair of word line trenches WT on both sides of the conductive expanded pad 116P. For example, the one or more expanded pad spacers 818S may protrude beyond the inner sidewall of the word line trench WT in the second horizontal direction (Y direction) such that the one or more expanded pad spacers 818S vertically overlaps (i.e., overlaps in the Z direction) a portion of the word line WL in the word line trench WT. However, a bottom surface of the one or more expanded pad spacers 818S may be at a second vertical level LV82 which is higher than the vertical level LVT of the main surface 102M of the substrate 102 and is lower than a first vertical level LV81. For example, the vertical level LVT of the main surface 102M of the substrate 102 may be a vertical level of a bottom surface of the conductive expanded pad 116P, and the first vertical level LV81 may be a vertical level of a top surface of the conductive expanded pad 116P.

A gate dielectric layer 820 and a buried insulating layer 824 included in the integrated circuit device 800 may have substantially the same configurations as those of the gate dielectric layer 520 and the buried insulating layer 524 described with reference to FIGS. 7A and 7B. However, the uppermost surface of each of the gate dielectric layer 820 and the buried insulating layer 824 may be higher than the vertical level LVT of the main surface 102M of the substrate 102 (e.g., the vertical level of the bottom surface of the conductive expanded pad 116P). A vertical level of the uppermost surface of each of the gate dielectric layer 820 and the buried insulating layer 824 may be the same as the second vertical level LV82 (e.g., a vertical level of the bottom surface of the one or more expanded pad spacers 818S). A top surface of the gate dielectric layer 820 may contact the bottom surface of the one or more expanded pad spacers 818S. The integrated circuit device 800 may include a gap-fill insulating layer 840 covering the top surface of the buried insulating layer 824. The gap-fill insulating layer 840 may contact each of the one or more expanded pad spacers 818S and the top surface of the buried insulating layer 824. The uppermost surface of the gap-fill insulating layer 840 may be at the same vertical level as the uppermost surface of the one or more expanded pad spacers 818S. Opposite sidewalls of the gap-fill insulating layer 840 may contact in the second horizontal direction (Y direction) a pair of the one or more expanded pad spacers 818S included in a pair of expanded pad structures XPS8 adjacent to each other among the plurality of expanded pad structures XPS8. In some embodiments, the gap-fill insulating layer 840 may include an oxide layer, a nitride layer, or a combination thereof.

Next, specific examples of a method of manufacturing an integrated circuit device according to some embodiments are described in detail.

FIGS. 11A to 18B are cross-sectional views sequentially illustrating a method of manufacturing the integrated circuit device 100 according to some embodiments. FIGS. 11A, 12A, 13A, 14A, 15A, 16A, 17A, and 18A are cross-sectional views sequentially illustrating some regions taken along the line X1-X1' in FIG. 1 according to a process sequence, and FIGS. 11B, 12B, 13B, 14B, 15B, and FIGS. 16B, 17B, and 18B are cross-sectional views sequentially illustrating some regions taken along the line Y1-Y1' of FIG. 1. The method of manufacturing the integrated circuit device 100 illustrated in FIGS. 1, 2A to 2C, and 3 is described with reference to FIGS. 11A to 18B. In FIGS. 11A to 18B, the same reference numerals as used in FIGS. 2A to 2C and FIG. 3 denote the same members, and redundant descriptions thereof are omitted here.

Figure 11A:
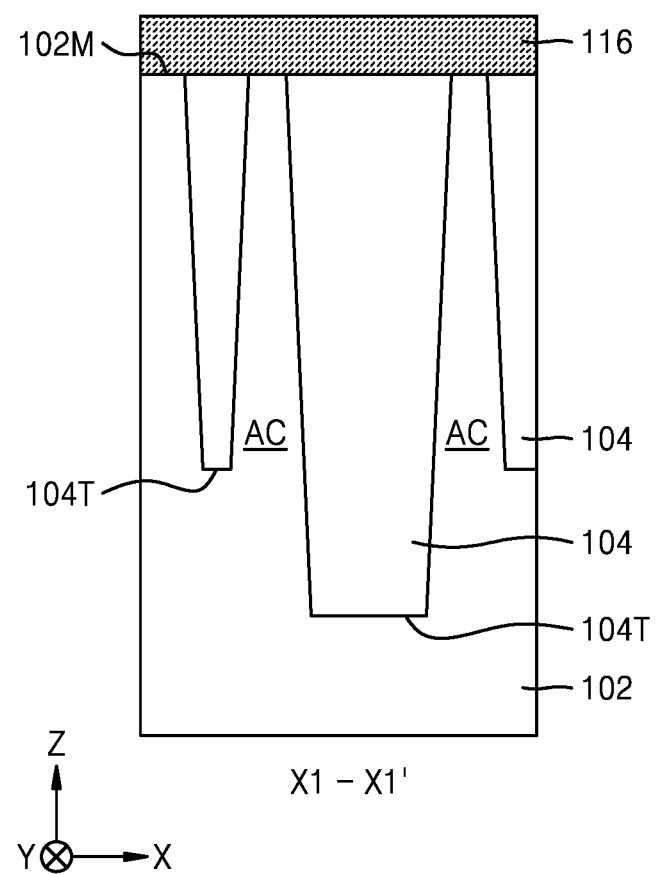
FIGS. 11A, 11B, 12A, 12B, 13A, 13B, 14A, 14B, 15A, 15B, 16A, 16B, 17A, 17B, 18A, and 18B are cross-sectional views sequentially illustrating a method of manufacturing an integrated circuit device according to some embodiments.
Figure 11B:
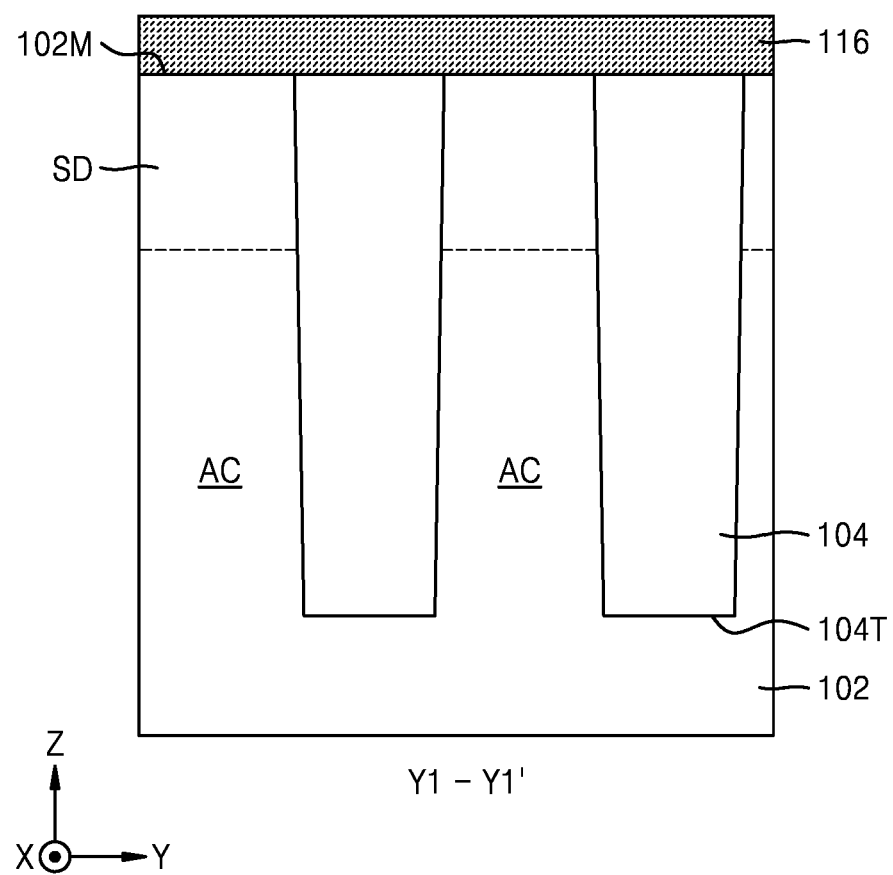

Referring to FIGS. 11A and 11B, a device isolation trench 104T defining the plurality of active regions AC may be formed on the substrate 102, the device isolation layer 104 filling the device isolation trench 104T may be formed, and the plurality of source/drain regions SD may be formed on the substrate 102 by an ion implantation process. Thereafter, the pad conductive layer 116 may be formed on the entire surface of the substrate 102 to cover the main surface 102M of the substrate 102 and a top surface of the device isolation layer 104. The pad conductive layer 116 may be formed of doped polysilicon. A dopant of the doped polysilicon may be phosphorous (P), and the doping concentration may be selected within the range of about $5E20/cm^3$ to about $20E20/cm^3$, but is not limited thereto.

Figure 12A:
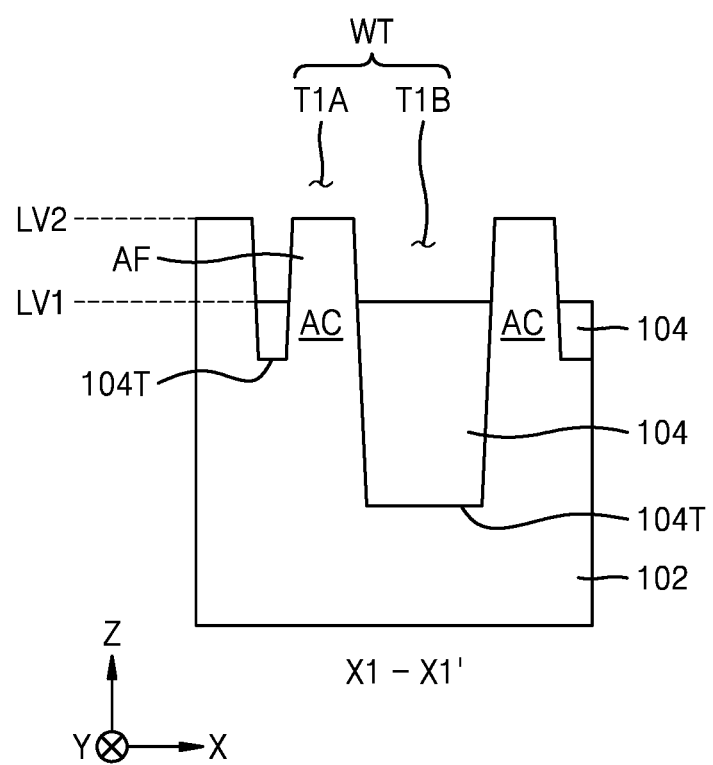
Figure 12B:
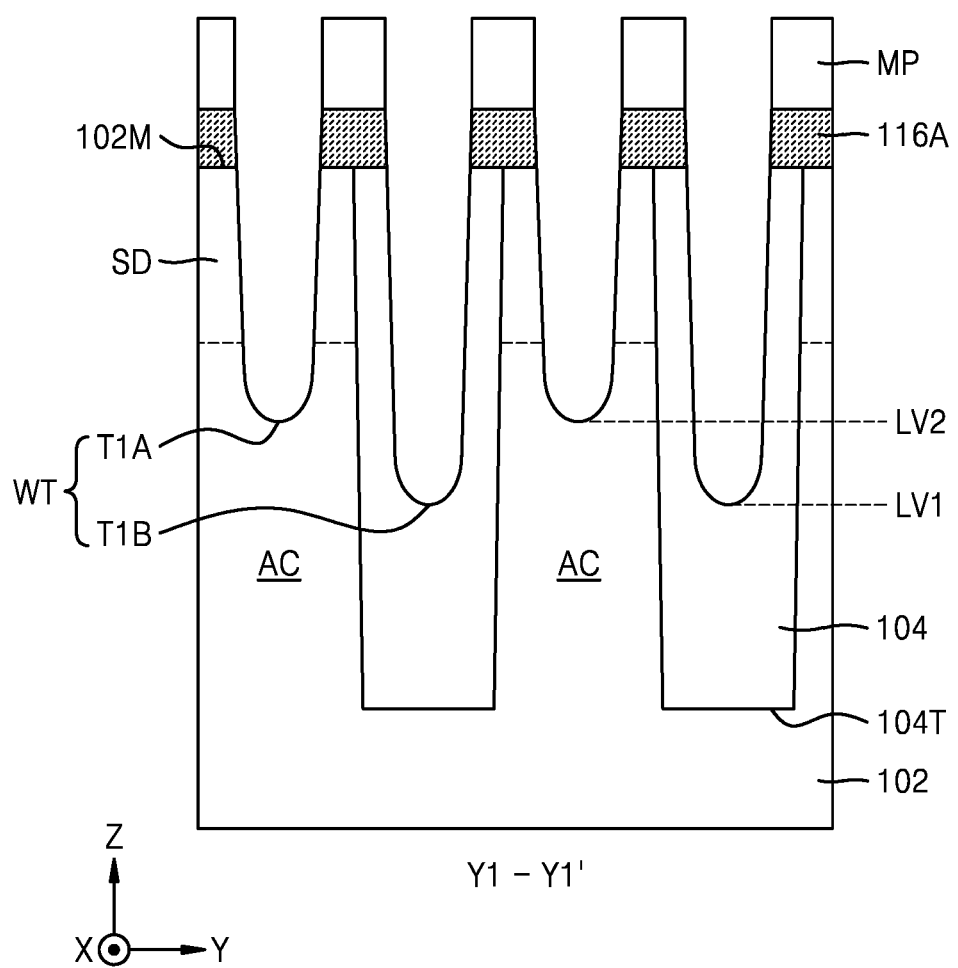

Referring to FIGS. 12A and 12B, in the resultant of FIGS. 11A and 11B, a mask pattern MP may be formed on the pad conductive layer 116. A part of the pad conductive layer 116, a part of the device isolation layer 104, and a part of the substrate 102 may be etched using the mask pattern MP as an etching mask. The plurality of pad conductive patterns 116A may be formed from the pad conductive layer 116, and the plurality of word line trenches WT may be formed in the substrate 102.

The plurality of word line trenches WT may be formed to extend in the first horizontal direction (X direction) across the plurality of active regions AC and the device isolation layer 104. The plurality of word line trenches WT may be formed to include a first trench portion T1A having a bottom surface exposing the substrate 102 and a second trench portion T1B having a bottom surface exposing the device isolation layer 104. The mask pattern MP may include an oxide layer, an amorphous carbon layer (ACL), an SiON layer, or a hard mask including a combination thereof.

In order to form the plurality of word line trenches WT, a first etching process of etching the substrate 102 and the device isolation layer 104 from the main surface 102M of the substrate 102 under the condition that etching rates of the substrate 102 and the device isolation layer 104 are approximately the same, and a second etching process of etching the substrate 102 and the device isolation layer 104 under the condition that the etching rate of the device isolation layer 104 is higher than that of the substrate 102 may be performed sequentially. As a result, a vertical level of the bottom surface of the second trench portion T1B exposing the device isolation layer 104 may be lower than a vertical level of the bottom surface of the first trench portion T1A exposing the substrate 102. For example, the bottom surface of the first trench portion T1A may be closer to the main surface 102M of the substrate 102 in the vertical direction (Z direction) than the bottom surface of the second trench portion T1B. After the plurality of word line trenches WT are formed, the plurality of active regions AC may include a plurality of fin regions AF protruding upward in the plurality of word line trenches WT.

According to a high integration of the integrated circuit device 100, an aspect ratio of each of the plurality of word line trenches WT may be relatively increased. Accordingly, after the etching process for forming the plurality of word line trenches WT is performed, an entrance CD of each of the plurality of word line trenches WT may be greater than that of a bottom CD. In this case, a width of each of the plurality of pad conductive patterns 116A in the second horizontal direction (Y direction) remaining on the substrate 102 between each of the plurality of word line trenches WT may be relatively reduced.

Figure 13A:
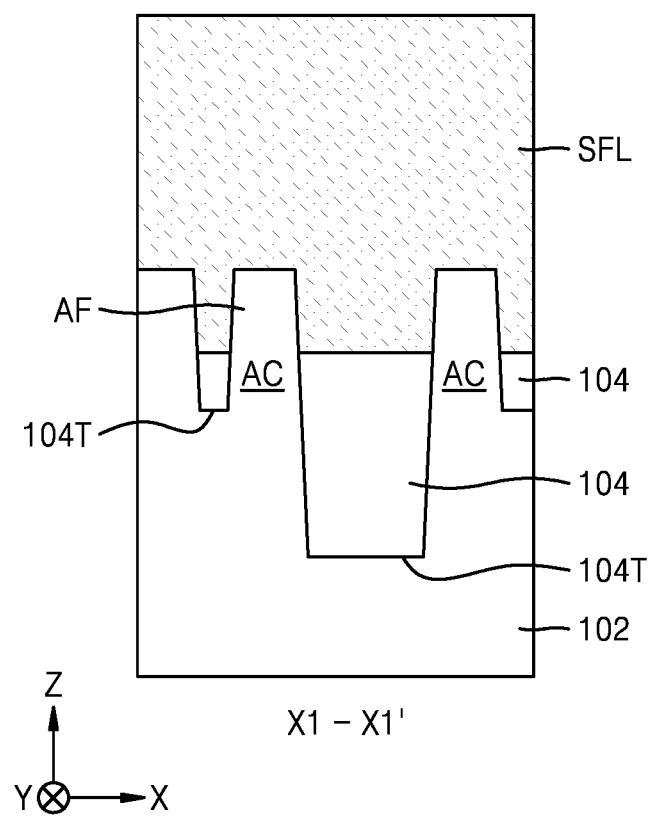
Figure 13B:
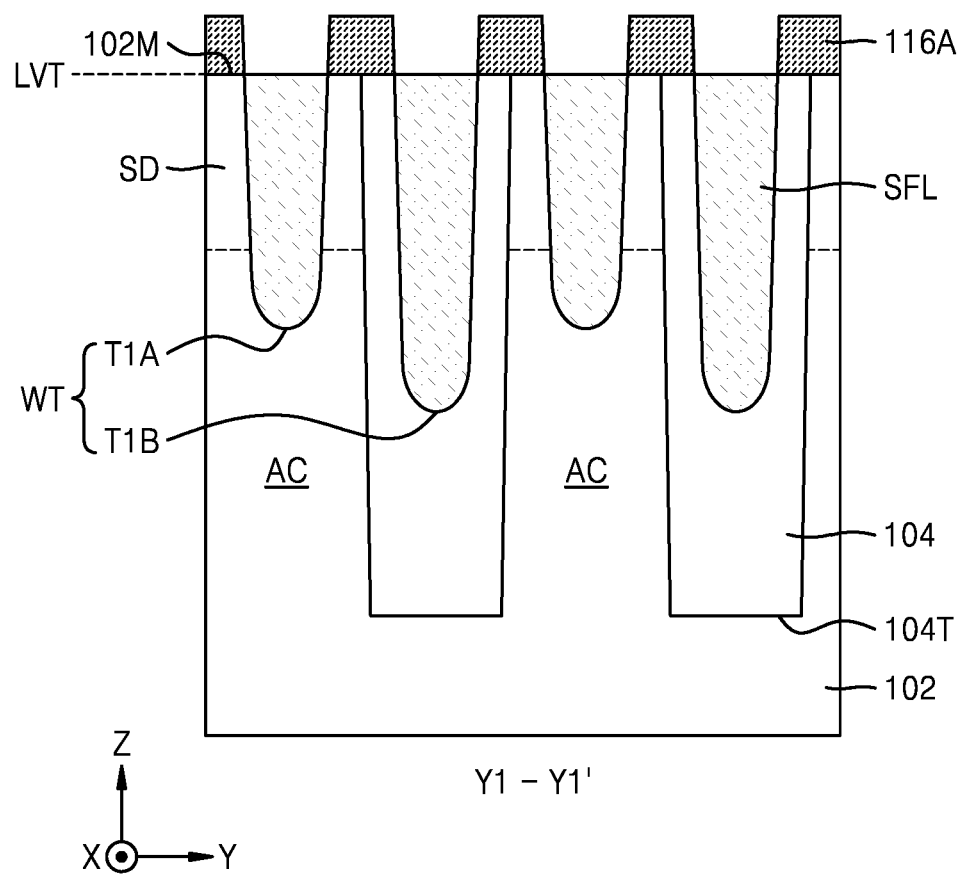

Referring to FIGS. 13A and 13B, the mask pattern MP may be removed from the resultant of FIGS. 12A and 12B, and the plurality of word line trenches WT may be filled with a plurality of sacrificial buried layers SFL. After the plurality of sacrificial buried layers SFL are formed, sidewalls and a top surface of each of the plurality of pad conductive patterns 116A may be exposed.

A vertical level of a top surface of each of the plurality of sacrificial buried layers SFL may be the same as the vertical level LVT of the main surface 102M of the substrate 102. The plurality of sacrificial buried layers SFL may be formed of a spin on hardmask (SOH) material. The SOH material may include an organic compound. In order to form the plurality of sacrificial buried layers SFL, an organic compound layer may be formed by spin coating a composition including the organic compound on the resultant of FIGS. 12A and 12B, and then performing a bake process of the resultant at least one time, which may be etched back to obtain the plurality of sacrificial buried layers SFL. The organic compound may include a hydrocarbon compound including an aromatic ring, such as phenyl, benzene, or naphthalene, or a derivative thereof.

Figure 14A:
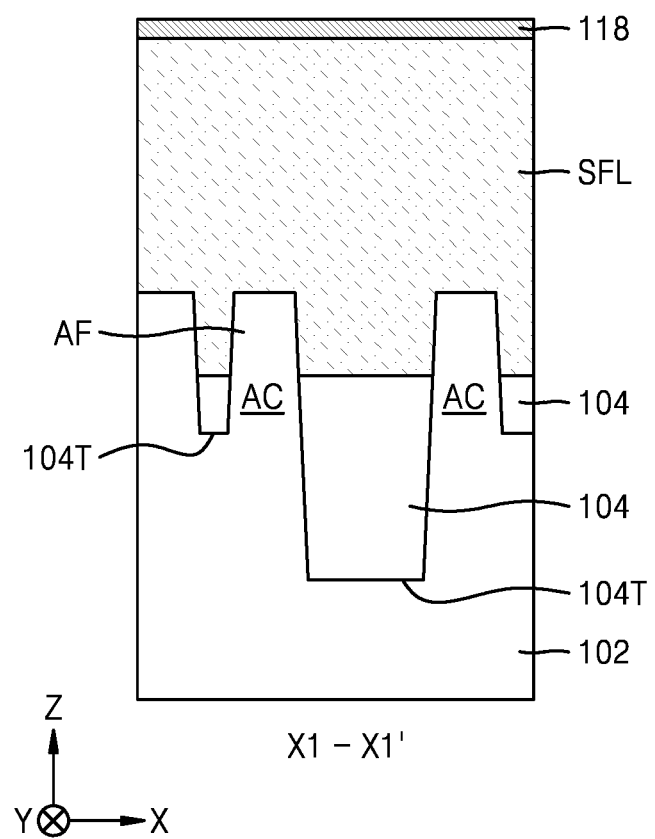
Figure 14B:
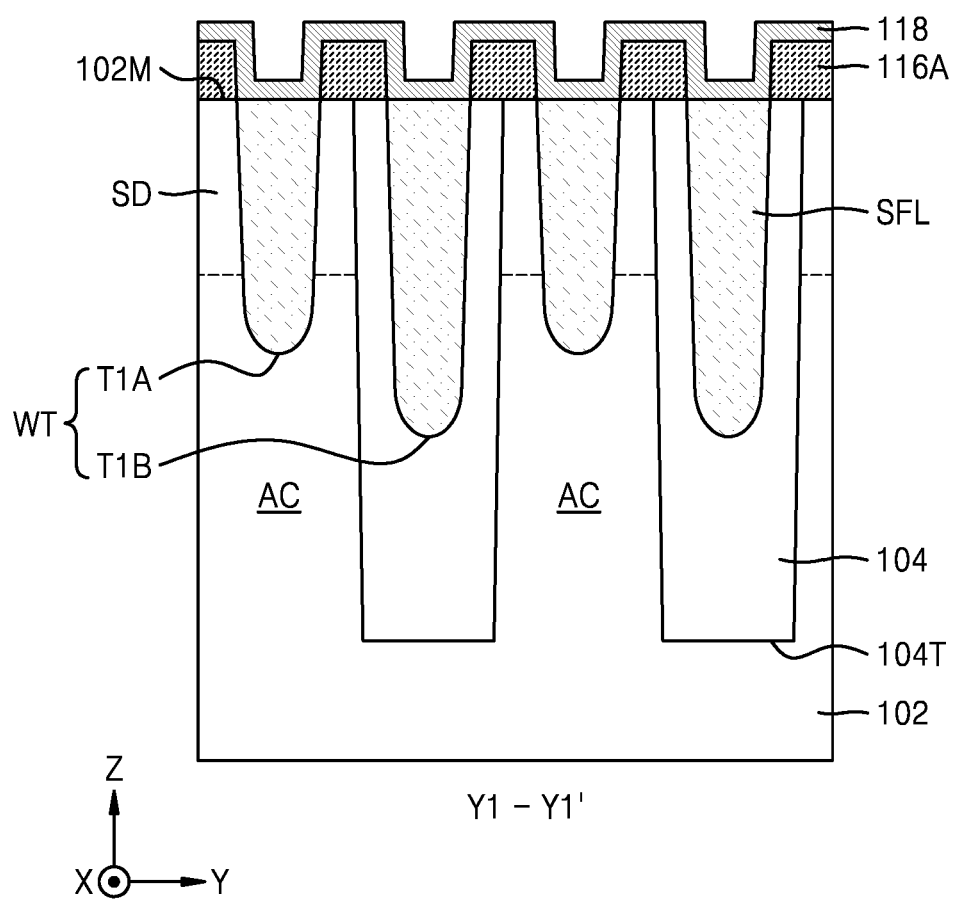

Referring to FIGS. 14A and 14B, the pad spacer layer 118 may be formed to conformally cover the surfaces exposed in the results of FIGS. 13A and 13B.

The pad spacer layer 118 may be formed to cover a surface of each of the plurality of pad conductive patterns 116A with a uniform thickness. In some embodiments, an atomic layer deposition (ALD) process may be used to form the pad spacer layer 118.

The pad spacer layer 118 may be formed of doped polysilicon or undoped polysilicon. When the pad spacer layer 118 is formed of doped polysilicon, a dopant of the doped polysilicon is phosphorous (P), and the doping concentration may be selected within the range of about $5E20/cm^3$ to about $20E20/cm^3$, but is not limited thereto.

Figure 15A:
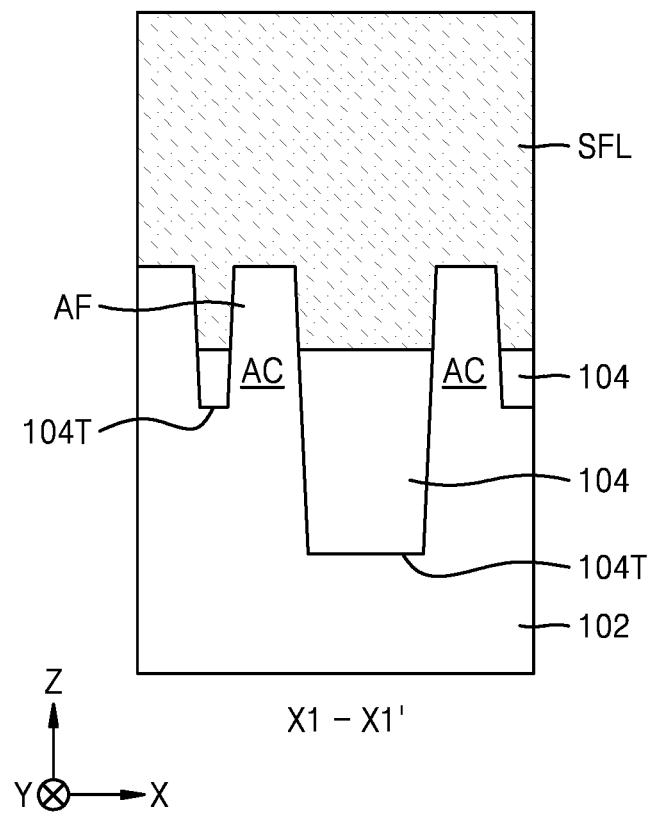
Figure 15B:
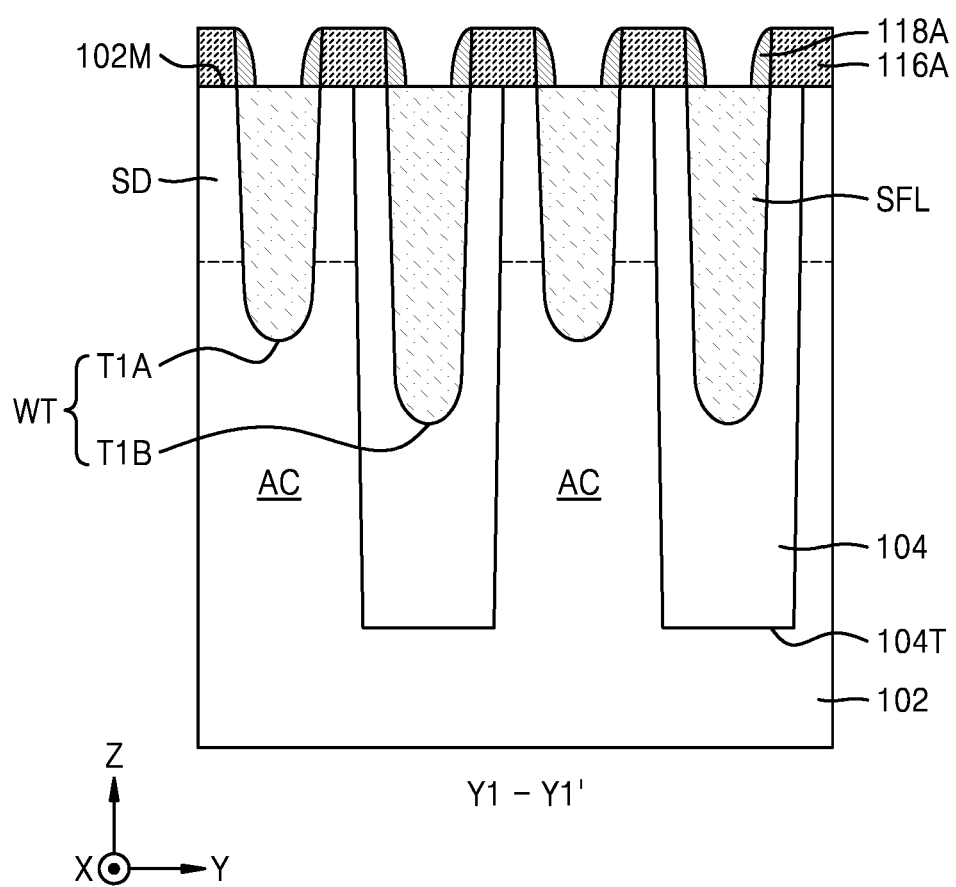

Referring to FIGS. 15A and 15B, a plurality of pad spacer patterns 118A may be formed from the pad spacer layer 118 by etching a part of the pad spacer layer 118 in the resultant of FIGS. 14A and 14B. Each of the plurality of pad spacer patterns 118A may be formed on a top surface of each of the sacrificial buried layers SFL to cover sidewalls of the pad conductive pattern 116A. A top surface of the sacrificial buried layer SFL may be exposed through a space between each of the plurality of pad spacer patterns 118A.

As described with reference to FIGS. 12A and 12B, even when the width of each of the plurality of pad conductive patterns 116A in the second horizontal direction (Y direction) remaining on the substrate 102 is relatively reduced, an insufficient contact area in each of the plurality of pad conductive patterns 116A may be compensated for by the plurality of pad spacer patterns 118A formed to be in contact with the sidewalls of each of the plurality of pad conductive patterns 116A.

Figure 16A:
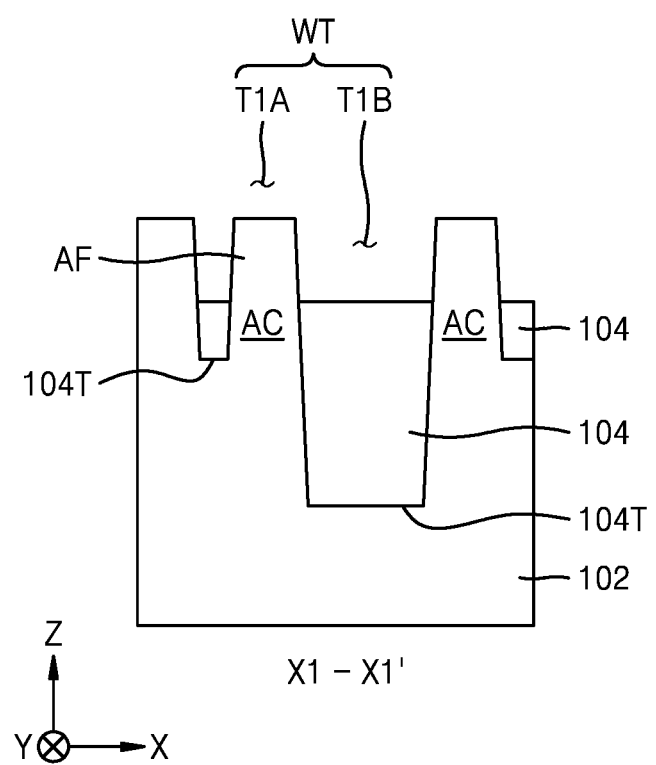
Figure 16B:
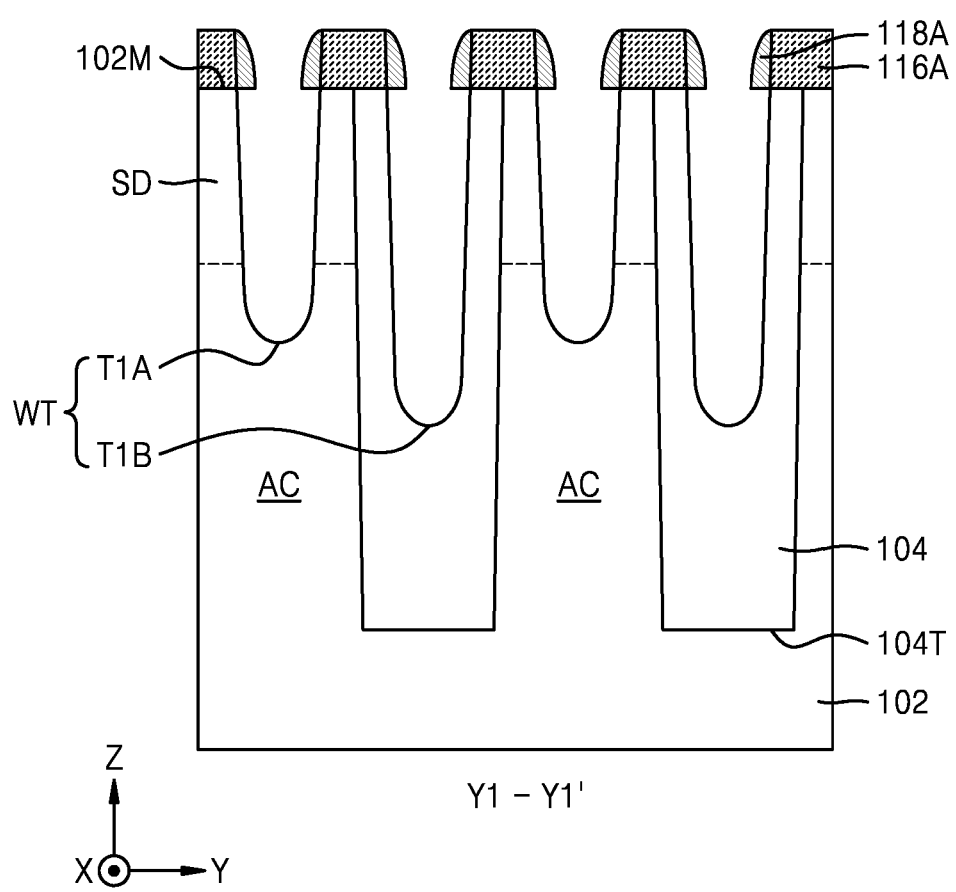

Referring to FIGS. 16A and 16B, inner sidewalls of each of the plurality of word line trenches WT may be exposed by removing the plurality of sacrificial buried layers SFL from the resultant of FIGS. 15A and 15B. In some embodiments, an ashing process and a strip process may be used to remove the plurality of sacrificial buried layers SFL.

Figure 17A:
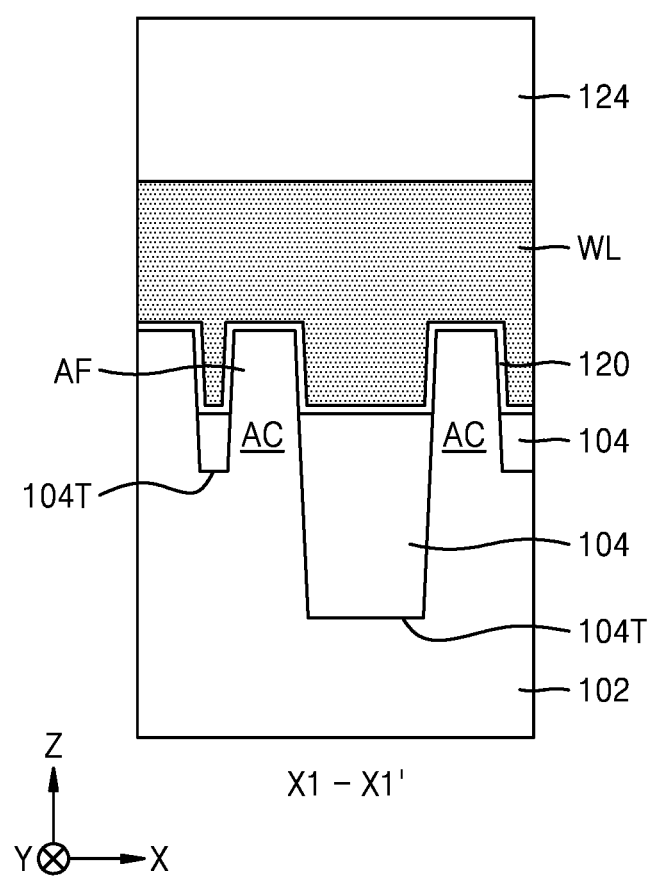
Figure 17B:
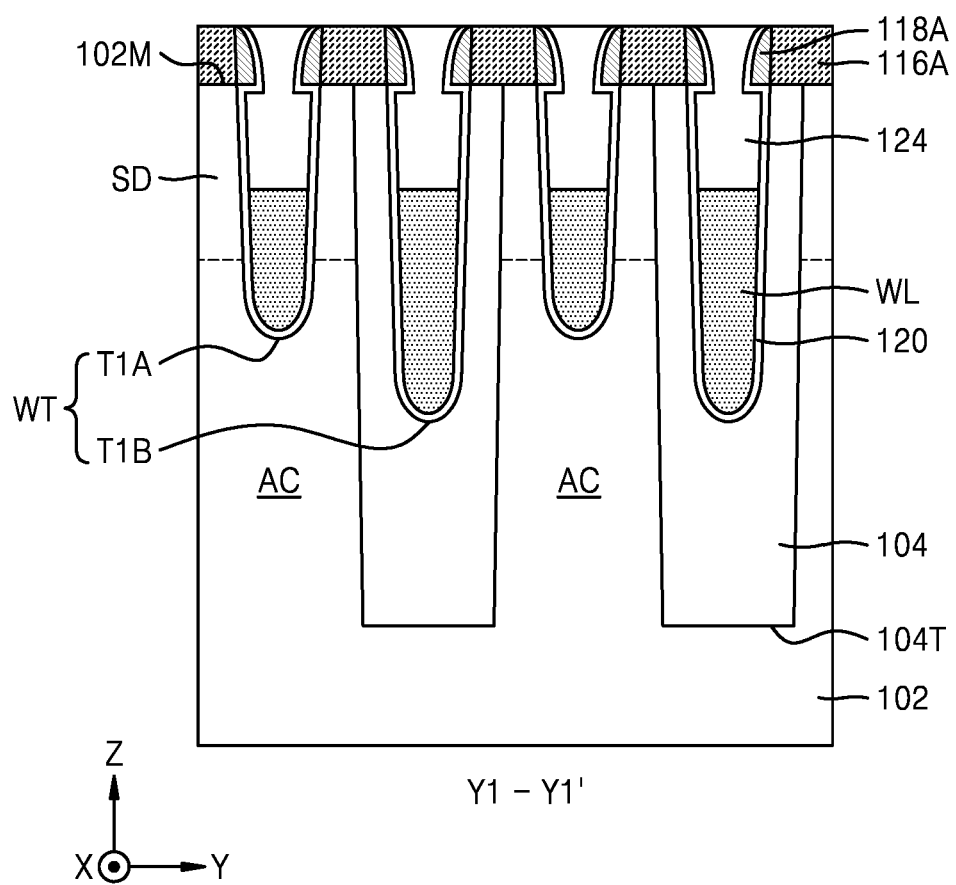

Referring to FIGS. 17A and 17B, in the resultant of FIGS. 16A and 16B, the gate dielectric layer 120 conformally covering the inner sidewalls of each of the plurality of word line trenches WT may be formed. An exposed surface of each of the plurality of pad conductive patterns 116A and the plurality of pad spacer patterns 118A may be formed. The plurality of word lines WL filling a part of each of the first trench portion T1A and the second trench portion T1B may be formed on the gate dielectric layer 120. The buried insulating layer 124 filling the remaining space of each of the plurality of word line trenches WT and remaining spaces between each of the plurality of pad spacer patterns 118A may be formed on the plurality of word lines WL. A resultant may be planarized to expose a top surface of each of the plurality of pad conductive patterns 116A. As a result, the plurality of gate dielectric layers 120 and the plurality of buried insulating layers 124 separated from each other for each of the plurality of word line trenches WT may be obtained.

The ALD process may be used to form the gate dielectric layer 120. In some embodiments, the gate dielectric layer 120 may be formed to have a thickness of about 10 Å to about 40 Å, but is not limited thereto.

In some embodiments, in order to form the plurality of word lines WL, a metal-containing barrier layer conformally covering the exposed surface of the gate dielectric layer 120 in the first trench portion T1A and the second trench portion T1B and a lower word line filling the first trench portion T1A and the second trench portion T1B on the metal-containing barrier layer may be formed, and then, unnecessary parts of the metal-containing barrier layer and the lower word line may be removed by etch-back so that only parts filling a part of each of the first trench portion T1A and the second trench portion T1B may remain. Thereafter, an upper word line covering the metal-containing barrier layer and the lower word line may be formed in the first trench portion T1A and the second trench portion T1B. Each of the plurality of buried insulating layers 124 may be formed to cover the upper word line.

Figure 18A:
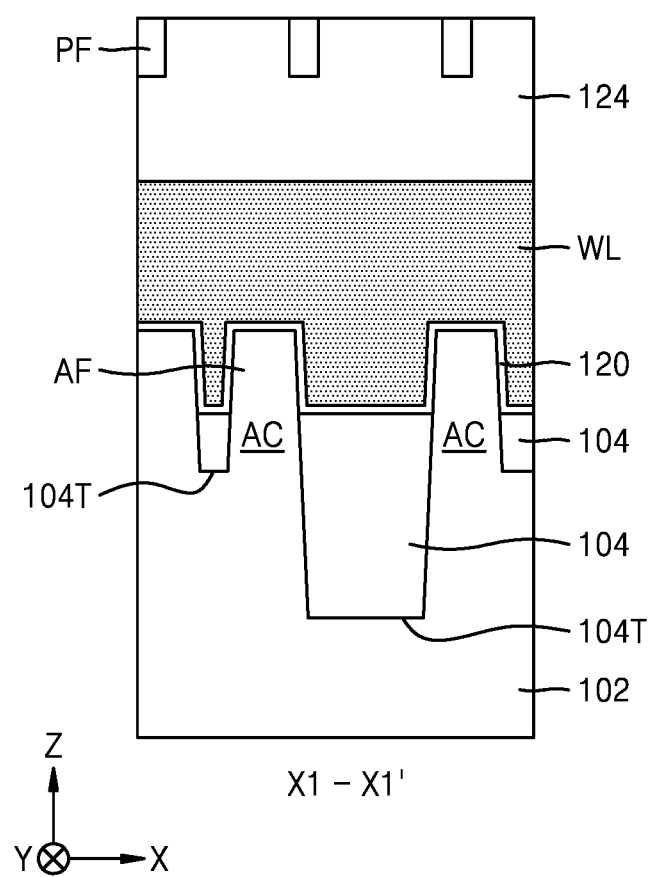
Figure 18B:
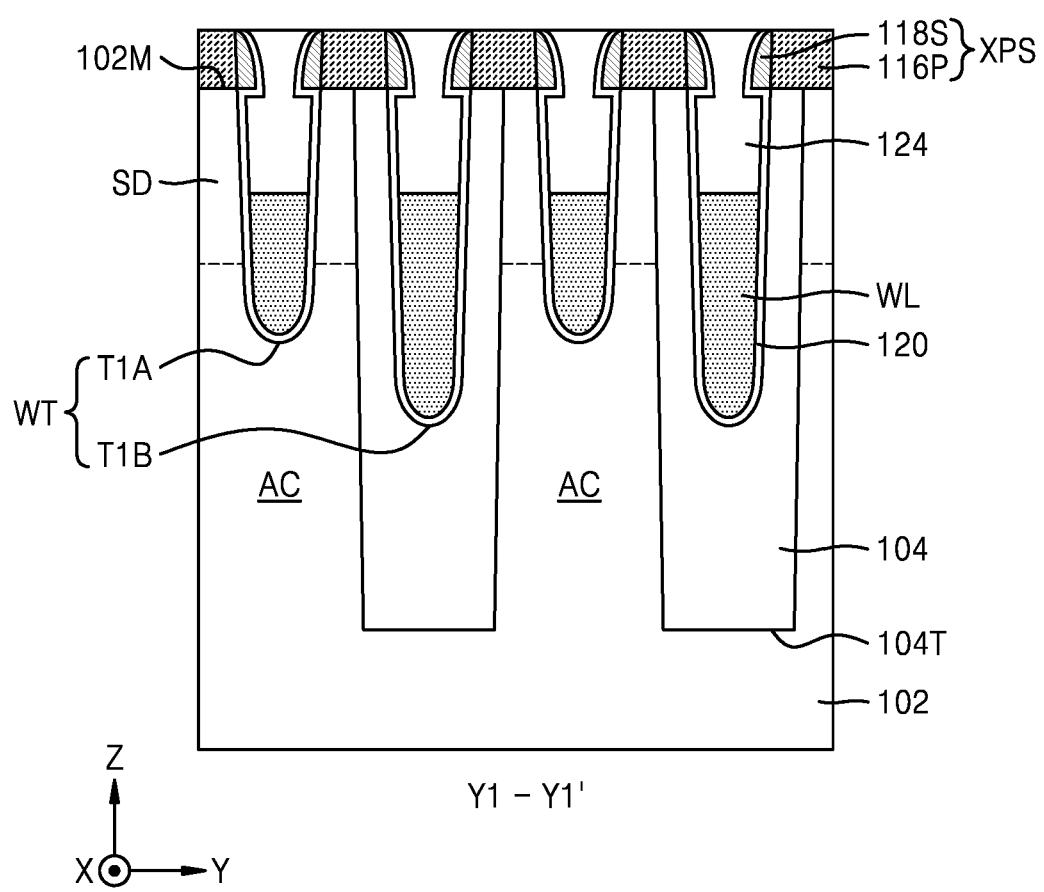

Referring to FIGS. 18A and 18B, in the resultant of FIGS. 17A and 17B, a partial region of each of the plurality of pad conductive patterns 116A and the plurality of pad spacer patterns 118A may be removed by an anisotropic dry etching process so that the plurality of conductive expanded pads 116P and the plurality of expanded pad spacers 118S may be respectively formed from the plurality of pad conductive patterns 116A and the plurality of pad spacer patterns 118A. The plurality of conductive expanded pads 116P and the plurality of expanded pad spacers 118S may constitute the plurality of expanded pad structures XPS.

In some embodiments, while a dry etching process for forming the plurality of conductive expanded pads 116P and the plurality of expanded pad spacers 118S is performed, top surfaces of the gate dielectric layer 120 and the plurality of buried insulating layers 124 may also be removed by a partial thickness, by appropriately controlling an etch selectivity of etch target materials. As a result, a plurality of empty spaces extending longitudinally in the second horizontal direction (Y direction) may be formed on the plurality of gate dielectric layers 120 and the plurality of buried insulating layers 124.

Thereafter, the plurality of pad separation fences PF filling empty spaces between each of the plurality of conductive expanded pads 116P, empty spaces between each of the plurality of expanded pad spacers 118S, and empty spaces between each of the plurality of buried insulating layers 124 may be formed in the first horizontal direction (X direction).

In some embodiments, while the dry etching process for forming the plurality of conductive expanded pads 116P and the plurality of expanded pad spacers 118S is performed, the plurality of gate dielectric layers 120 and the plurality of buried insulating layers 124 may remain as they are without being removed, by appropriately controlling the etch selectivity of the etch target materials. In this case, different from what is illustrated in FIG. 18A, the plurality of pad separation fences PF may be formed only in empty spaces between each of the plurality of conductive expanded pads 116P and empty spaces between each of the plurality of expanded pad spacers 118S but may not be formed on the plurality of buried insulating layers 124.

Thereafter, as illustrated in FIGS. 1, 2A to 2C, and 3, the integrated circuit device 100 may be manufactured by forming the buffer insulating layer 130 covering a top surface of each of the plurality of expanded pad structures XPS, the plurality of gate dielectric layers 120, the plurality of buried insulating layers 124, and the plurality of pad separation fences PF. Further, the integrated circuit device 100 may be manufactured by forming the plurality of direct contact holes DCH and the plurality of contact insulating spacers DCS, and forming the plurality of direct contacts DC, the plurality of bit lines BL, the plurality of insulating spacers 146, the plurality of insulating fences 142, the plurality of conductive plugs 140P, the plurality of metal silicide layers 172, the plurality of conductive landing pads LP, and the insulating layer 180.

According to the method of manufacturing the integrated circuit device 100 described with reference to FIGS. 11A to 18B, each of the plurality of expanded pad structures XPS is formed to include the conductive expanded pad 116P and the one or more expanded pad spacers 118S covering opposite sidewalls of the conductive expanded pad 116P in the second horizontal direction (Y direction). Therefore, even when the width of the conductive expanded pad 116P in the second horizontal direction (Y direction) is relatively reduced, the contact area in the conductive expanded pad 116P that may be insufficient in the plurality of expanded pad structures XPS may be compensated for by the one or more expanded pad spacers 118S. Accordingly, a sufficient contact area may be secured between the expanded pad structure XPS and the conductive plug 140P, and the reliability of the integrated circuit device 100 may be improved.

Figure 19A:
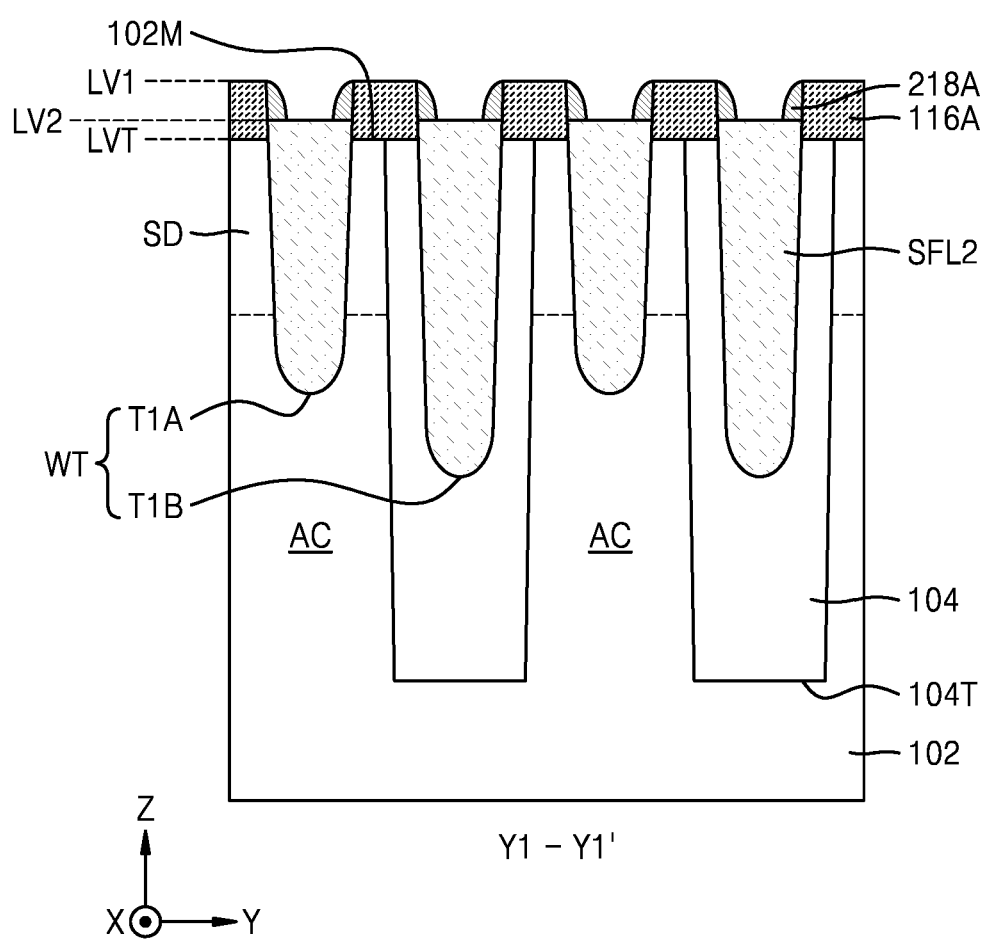
FIGS. 19A and 19B are cross-sectional views sequentially illustrating a method of manufacturing an integrated circuit device according to some embodiments.
Figure 19B:
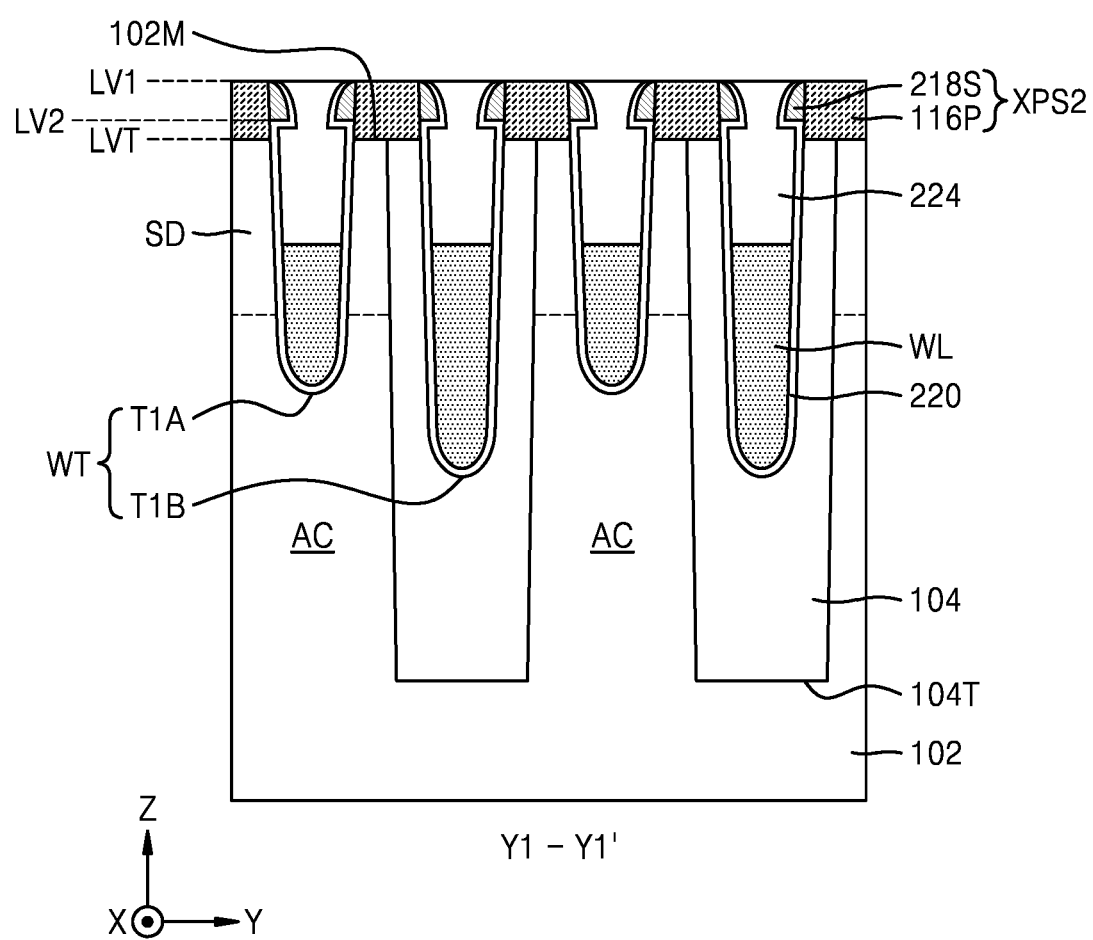

FIGS. 19A and 19B are cross-sectional views sequentially illustrating a method of manufacturing the integrated circuit device 200 according to some embodiments. FIGS. 19A and 19B are cross-sectional views sequentially illustrating components of some regions taken along the line Y1-Y1' of FIG. 1. The method of manufacturing the integrated circuit device 200 illustrated in FIG. 4 is described with reference to FIGS. 19A and 19B. In FIGS. 19A and 19B, the same reference numerals as used in FIGS. 2A to 2C, 3, 4, and 11A to 18B denote the same members, and redundant descriptions thereof are omitted here.

Referring to FIG. 19A, processes similar to those described with reference to FIGS. 11A to 13B may be performed to fill the plurality of word line trenches WT with the plurality of sacrificial buried layers SFL2. A detailed configuration of the plurality of sacrificial buried layers SFL2 is substantially the same as that of the plurality of sacrificial buried layers SFL described with reference to FIGS. 13A and 13B. However, a top surface of each of the plurality of sacrificial buried layers SFL2 may be at the second vertical level LV2 that is higher than the vertical level LVT of the main surface 102M of the substrate 102 and is lower than the first vertical level LV1 (e.g., a vertical level of a top surface of the conductive expanded pad 116P).

Thereafter, similarly to the process of forming the plurality of pad spacer patterns 118A described with reference to FIGS. 14A to 15B, a plurality of pad spacer patterns 218A each covering sidewalls of the plurality of pad conductive patterns 116A on a top surface of each of a plurality of sacrificial buried layers SFL2 may be formed. The top surface of the sacrificial buried layer SFL2 may be exposed through a space between each of the plurality of pad spacer patterns 218A.

Referring to FIG. 19B, the integrated circuit device 200 illustrated in FIG. 4 may be manufactured by removing the plurality of sacrificial buried layers SFL2 from the resultant of FIG. 19A, forming the plurality of expanded pad structures XPS2 each including the conductive expanded pad 116P and the one or more expanded pad spacers 218S by performing processes as described with reference to FIGS. 17A to 18B, and forming the plurality of gate dielectric layers 220, the plurality of word lines WL, and the plurality of buried insulating layers 224.

Figure 20A:
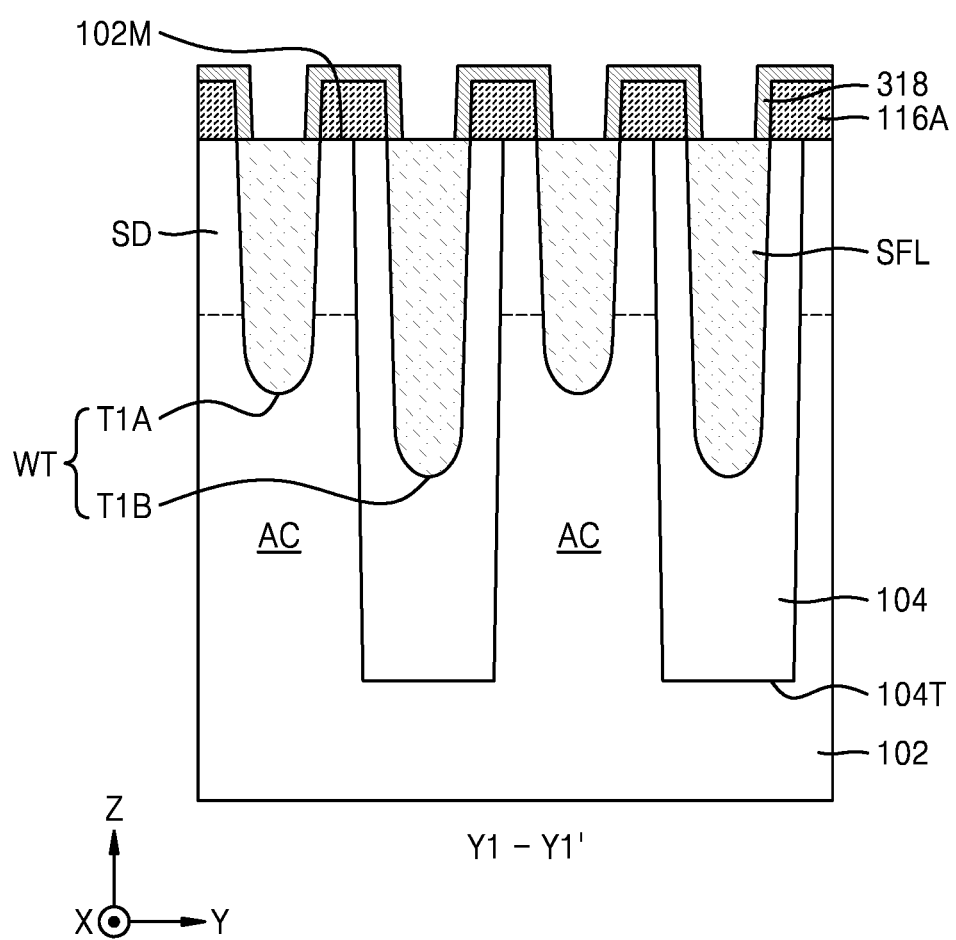
FIGS. 20A and 20B are cross-sectional views sequentially illustrating a method of manufacturing an integrated circuit device according to some embodiments.
Figure 20B:
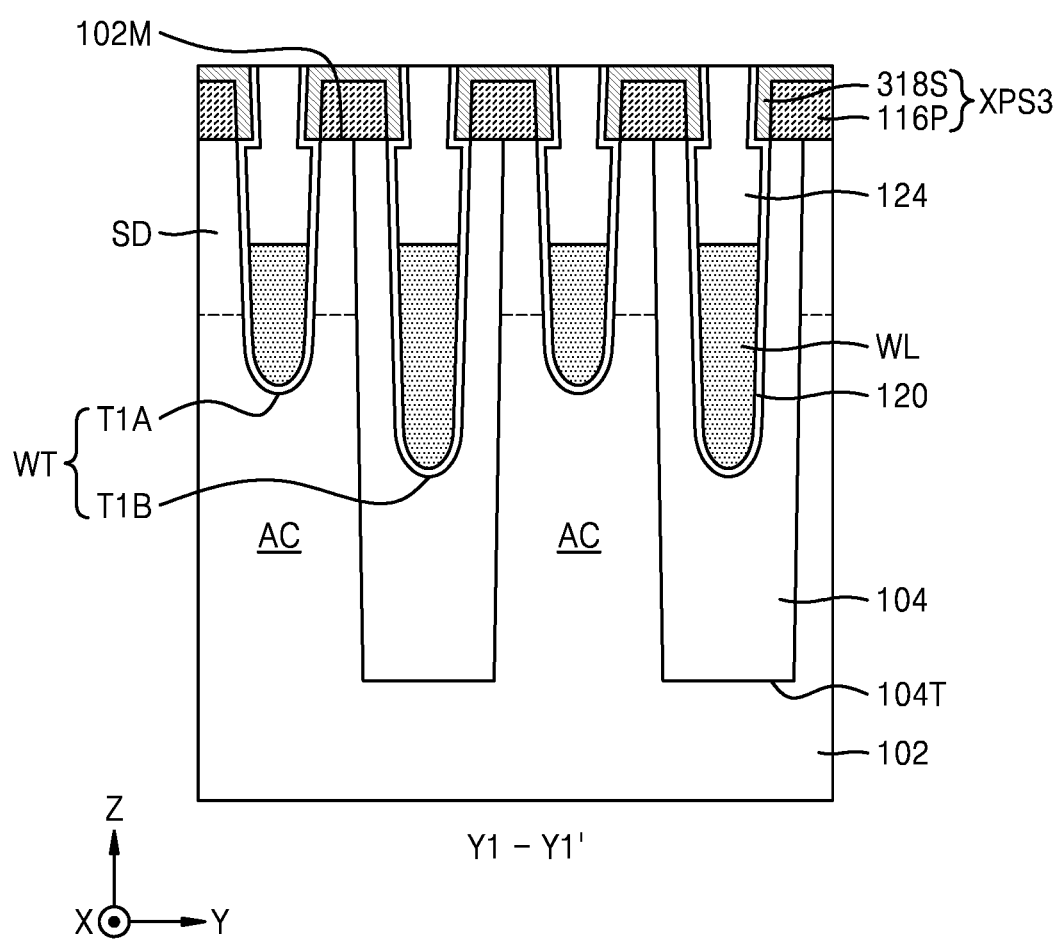

FIGS. 20A and 20B are cross-sectional views sequentially illustrating a method of manufacturing the integrated circuit device 300 according to some embodiments. FIGS. 20A and 20B are cross-sectional views sequentially illustrating components of some regions taken along the line Y1-Y1' of FIG. 1. The method of manufacturing the integrated circuit device 300 illustrated in FIG. 5 is described with reference to FIGS. 20A and 20B. In FIGS. 20A and 20B, the same reference numerals as used in FIGS. 2A to 2C, 3, 5, and 11A to 18B denote the same members, and redundant descriptions thereof are omitted here.

Referring to FIG. 20A, processes similar to those described with reference to FIGS. 11A to 13B may be performed to fill the plurality of word line trenches WT with the plurality of sacrificial buried layers SFL. Thereafter, a plurality of pad spacer layers 318 covering opposite sidewalls and a top surface of each of the plurality of pad conductive patterns 116A may be formed.

In some embodiments, an epitaxial growth process may be used to form the plurality of pad spacer layers 318. In some embodiments, the plurality of pad spacer layers 318 may include doped epitaxially grown silicon or undoped epitaxially grown silicon. A top surface of the sacrificial buried layer SFL may be exposed through a space between each of the plurality of pad spacer layers 318.

Referring to FIG. 20B, the integrated circuit device 300 illustrated in FIG. 5 may be manufactured by removing the plurality of sacrificial buried layers SFL from the resultant of FIG. and forming the plurality of expanded pad structures XPS3 each including the conductive expanded pad 116P and the one or more expanded pad spacers 318S respectively obtained from the pad conductive pattern 116A and the pad spacer layer 318 by performing processes similar to those described with reference to FIGS. 17A to 18B.

In order to manufacture the integrated circuit device 400 illustrated in FIG. 6, processes similar to those of the method of manufacturing the integrated circuit device 300 described with reference to FIGS. 20A and 20B may be performed. However, in the process described with reference to FIG. 20A, instead of the plurality of sacrificial buried layers SFL, a plurality of sacrificial buried layers (not shown) each having a top surface of the vertical level LV4 (see FIG. 6) that is higher than the vertical level LVT of the main surface 102M of the substrate 102 and is lower than the top surface of the pad conductive pattern 116A (e.g., the first vertical level LV31 in FIG. 6) may be formed. As a result, one or more expanded pad spacers 418S having a bottom surface of the vertical level LV4 may be formed in a subsequent process.

Figure 21A:
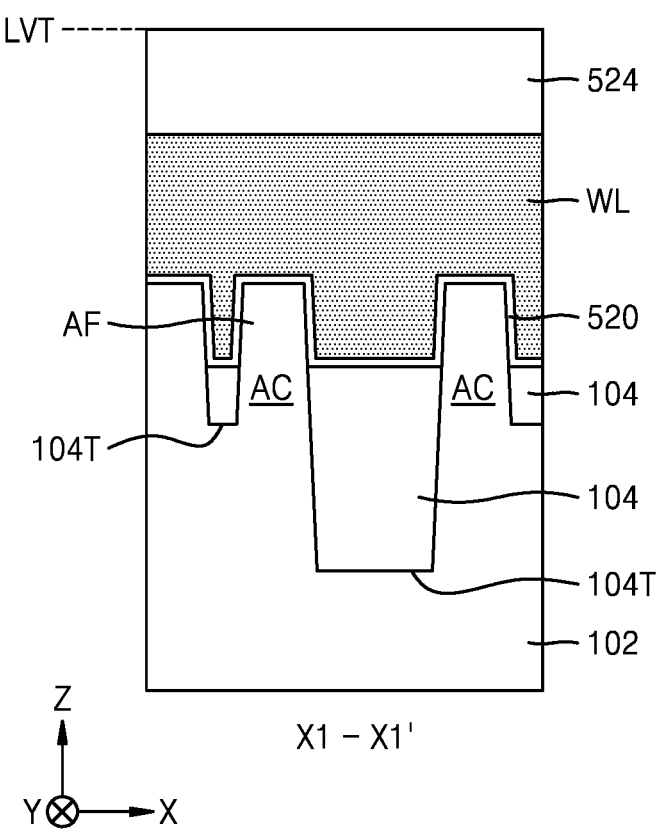
FIGS. 21A, 21B, 22A and 22B are cross-sectional views sequentially illustrating a method of manufacturing an integrated circuit device according to some embodiments.
Figure 21B:
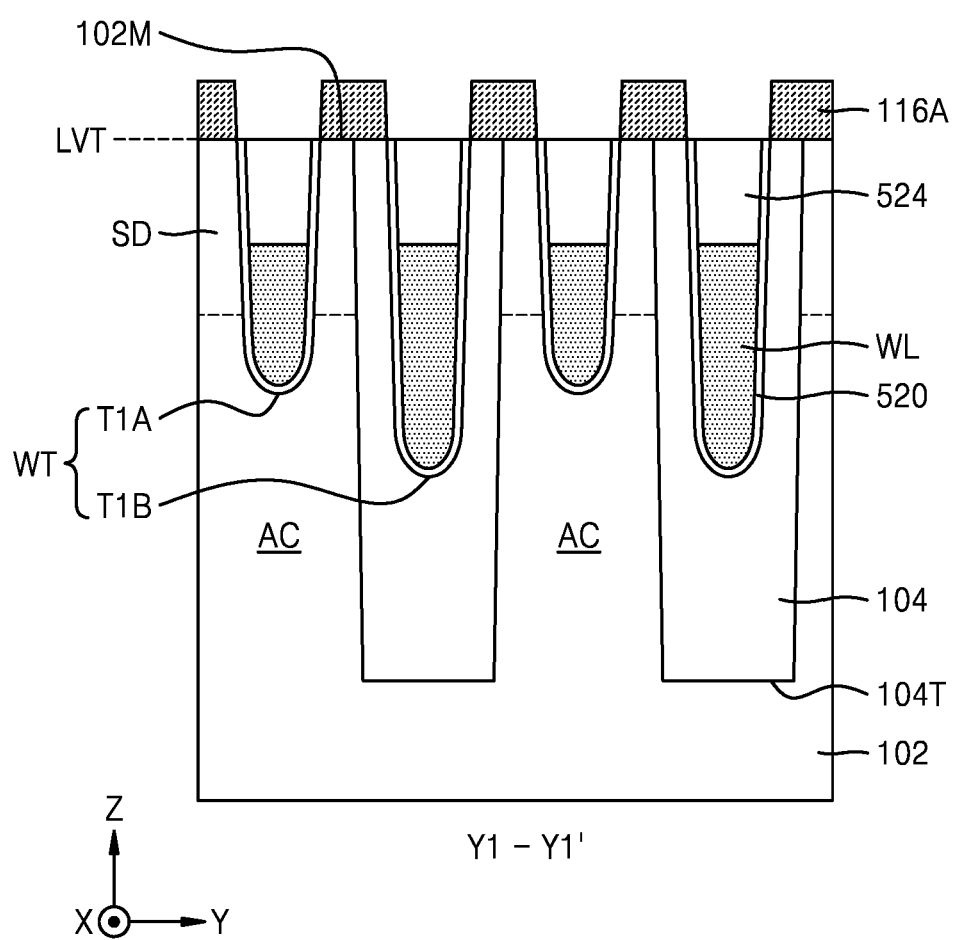
Figure 22A:
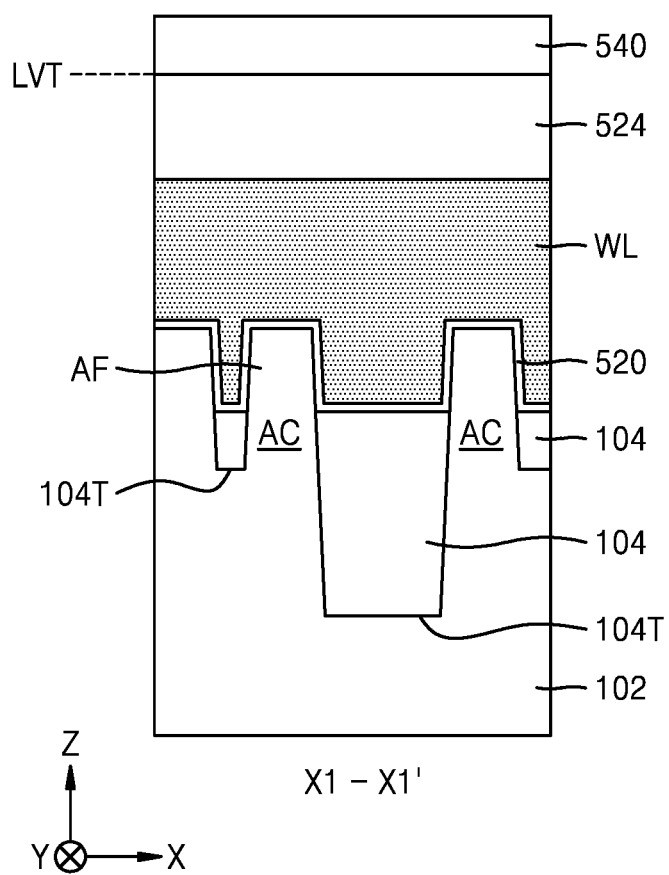
Figure 22B:
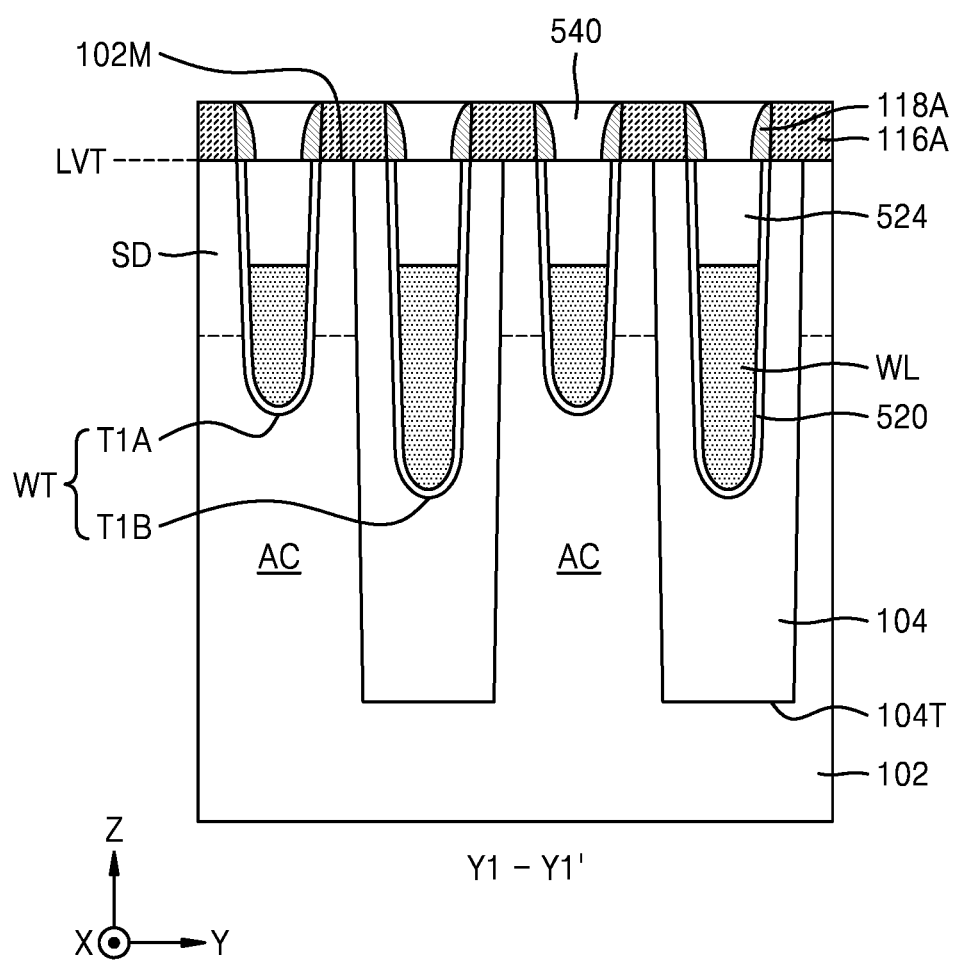

FIGS. 21A to 22B are cross-sectional views sequentially illustrating a method of manufacturing the integrated circuit device 500 according to some embodiments. FIGS. 21A and 22A are cross-sectional views sequentially illustrating some regions taken along the line X1-X1' in FIG. 1, and FIGS. 21B and 22B are cross-sectional views sequentially illustrating some regions taken along the line Y1-Y1' of FIG. 1. The method of manufacturing the integrated circuit device 500 illustrated in FIGS. 7A and 7B is described with reference to FIGS. 21A to 22B. In FIGS. 21A to 22B, the same reference numerals as used in FIGS. 2A to 2C, 3, 7A, 7B, and 11A to 18B denote the same members, and redundant descriptions thereof are omitted here.

Referring to FIGS. 21A and 21B, processes described with reference to FIGS. 11A to 12B may be performed. Thereafter, the mask pattern MP may be removed from the resultant of FIGS. 12A and 12B, and the gate dielectric layer 520, the word line WL, and the buried insulating layer 524 may be formed inside each of the plurality of word line trenches WT similarly to that described with reference to FIGS. 17A and 17B. Thereafter, sidewalls of each of the plurality of pad conductive patterns 116A may be exposed by removing a top surface of each of the gate dielectric layer 520 and the buried insulating layer 524 by a partial thickness from the obtained resultant. A vertical level of a top surface of each of the gate dielectric layer 520 and the buried insulating layer 524 may be the same as the vertical level LVT of the main surface 102M of the substrate 102.

Referring to FIGS. 22A and 22B, the plurality of pad spacer patterns 118A may be formed on the resultant of FIGS. 21A and 21B in the same manner as described with reference to FIGS. 14A to 15B, and the plurality of gap-fill insulating layers 540 filling a space between two adjacent pad spacer patterns 118A among the plurality of pad spacer patterns 118A may be formed.

Thereafter, similarly to that described with reference to FIGS. 18A and 18B, a partial region of each of the plurality of pad conductive patterns 116A and the plurality of pad spacer patterns 118A may be removed by an anisotropic dry etching process to form the plurality of expanded pad structures XPS (see FIG. 7B) including the conductive expanded pad 116P and the one or more expanded pad spacers 118S respectively from the conductive pattern 116A and the plurality of pad spacer patterns 118A. In this regard, some regions of the plurality of gap-fill insulating layers 540 may also be removed to form empty spaces.

Thereafter, the plurality of pad separation fences PF (see FIG. 7A) filling empty spaces between each of the plurality of conductive expanded pads 116P, empty spaces between each of the plurality of expanded pad spacers 118S, and empty spaces of the plurality of gap-fill insulating layers 540 may be formed in the first horizontal direction (X direction).

In some embodiments, while a dry etching process for forming the plurality of conductive expanded pads 116P and the plurality of expanded pad spacers 118S is performed, the gap-fill insulating layer 540 may remain as it is without being removed, by appropriately controlling the etch selectivity of etch target materials. In this case, an integrated circuit device having a structure different from that illustrated in FIG. 7A may be obtained. For example, in the final structure of the integrated circuit device, the gap-fill insulating layer 540 may continuously extend seamlessly in the first horizontal direction (X direction) similarly to that illustrated in FIG. 22A.

Thereafter, as described with reference to FIGS. 7A and 7B, the integrated circuit device 500 may be manufactured by forming the buffer insulating layer 130 covering a top surface of each of the plurality of expanded pad structures XPS, the plurality of gap-fill insulating layers 540, and the plurality of pad separation fences PF, and performing the subsequent processes described with reference to FIGS. 18A and 18B.

As described above, the methods of manufacturing the integrated circuit devices 100, 200, 300, 400, and 500 illustrated in FIGS. 1 to 7B have been described with reference to FIGS. 11A to 22B, but one of ordinary skill in the art will appreciate that the integrated circuit devices 600, 700, and 800 illustrated in FIGS. 8 to 10 and integrated circuit devices having variously modified and changed structures may be manufactured therefrom, by applying various modifications and changes to those described with reference to FIGS. 11A to 22B within the scope of the present disclosure.

According to the method of manufacturing the integrated circuit device according to some embodiments, each of the plurality of expanded pad structures is formed to include the conductive expanded pad and the plurality of expanded pad spacers covering opposite sidewalls of the conductive expanded pad. Accordingly, even when the width of the conductive expanded pad is relatively reduced, a contact area that may be insufficient with the conductive expanded pad in the plurality of expanded pad structures may be compensated for by the one or more expanded pad spacers. Accordingly, a sufficient contact area may be secured between the expanded pad structure and the conductive plug disposed thereon, and reliability of the integrated circuit device may be improved.

While the present disclosure has been particularly shown and described with reference to embodiments thereof, it will be understood that various changes in form and details may be made therein without departing from the scope of the following claims.

What is claimed is:

1. An integrated circuit device comprising:
   a substrate comprising an active region and a word line trench extending longitudinally in a first horizontal direction across the active region;
   a word line in the word line trench and extending longitudinally in the first horizontal direction at a vertical level lower than a main surface of the substrate;
   a buried insulating layer on the word line in the word line trench;
   a conductive plug on the substrate; and
   a pad structure on the substrate and having a first portion in contact with a top surface of the active region and a second portion in contact with the conductive plug,
   wherein the pad structure comprises:
   a conductive pad having a bottom surface in contact with the top surface of the active region and a first sidewall extending along an extension line of an inner sidewall of the word line trench, and a pad spacer in contact with the first sidewall of the conductive pad and protruding beyond the inner sidewall of the word line trench in a second horizontal direction orthogonal to the first horizontal direction such that the pad spacer vertically overlaps a portion of the word line in the word line trench.

2. The integrated circuit device of claim 1,
wherein the conductive pad comprises doped polysilicon, and
the pad spacer comprises doped polysilicon, undoped polysilicon, doped epitaxially grown silicon, or undoped epitaxially grown silicon.

3. The integrated circuit device of claim 1, wherein an uppermost surface of the buried insulating layer is at a same vertical level as an uppermost surface of the pad structure.

4. The integrated circuit device of claim 1,
wherein the pad spacer is on the first sidewall and a top surface of the conductive pad,
an uppermost surface of the buried insulating layer is at a same vertical level as an uppermost surface of the pad spacer, and
an uppermost surface of the conductive pad is closer to the substrate than the uppermost surface of the buried insulating layer.

5. The integrated circuit device of claim 1, wherein an uppermost surface of the buried insulating layer is closer to the substrate than an uppermost surface of the pad structure.

6. The integrated circuit device of claim 1, further comprising a gap-fill insulating layer in contact with each of the pad spacer and a top surface of the buried insulating layer,
wherein an uppermost surface of the gap-fill insulating layer is at a same vertical level as an uppermost surface of the pad structure.

7. The integrated circuit device of claim 1, further comprising a gap-fill insulating layer in contact with each of the pad spacer and a top surface of the buried insulating layer,
wherein the pad spacer is on the first sidewall and a top surface of the conductive pad, and
an uppermost surface of the gap-fill insulating layer is at a same vertical level as an uppermost surface of the pad spacer.

8. The integrated circuit device of claim 1, further comprising a gate dielectric layer surrounding the word line and the buried insulating layer in the word line trench and between the buried insulating layer and the pad structure,
wherein an uppermost surface of the gate dielectric layer is at a same vertical level as an uppermost surface of the pad structure.

9. The integrated circuit device of claim 1, further comprising a gate dielectric layer surrounding the word line and the buried insulating layer in the word line trench,
wherein a top surface of the gate dielectric layer is in contact with a bottom surface of the pad spacer.

10. The integrated circuit device of claim 1,
further comprising a bit line extending longitudinally in the second horizontal direction on the substrate at a vertical level higher than a vertical level of a top surface of the conductive pad; and
a direct contact electrically connected between the bit line and the active region and spaced apart from the pad structure.

11. An integrated circuit device comprising:
a substrate comprising a plurality of active regions spaced apart from each other and a plurality of word line trenches each extending longitudinally in a first horizontal direction across some of the plurality of active regions;
a plurality of word lines each inside respective ones of the plurality of word line trenches and extending longitudinally in the first horizontal direction at a vertical level lower than a main surface of the substrate;
a plurality of bit lines extending longitudinally in a second horizontal direction perpendicular to the first horizontal direction on the substrate;
a plurality of conductive plugs respectively in spaces between each of the plurality of bit lines and electrically connected to one active region of the plurality of active regions; and
a plurality of pad structures between the substrate and the plurality of conductive plugs,
wherein each of the plurality of pad structures comprises:
a conductive pad having opposite sidewalls in the second horizontal direction and a bottom surface, the bottom surface being in contact with the main surface of the substrate between a pair of word line trenches of the plurality of word line trenches and adjacent to each other, and the opposite sidewalls extending along an extension line of an inner sidewall of each of the pair of word line trenches, and
one or more pad spacers in contact with the opposite sidewalls of the conductive pad and protruding beyond the inner sidewall of each of the pair of word line trenches such that the one or more pad spacers vertically overlaps a portion of a word line of the plurality of word lines inside each of the pair of word line trenches.

12. The integrated circuit device of claim 11,
wherein each of the conductive pad and the one or more pad spacers comprises doped polysilicon, and
a doping concentration in the one or more pad spacers is equal to or less than a doping concentration in the conductive pad.

13. The integrated circuit device of claim 11, further comprising a plurality of buried insulating layers each inside respective ones of the plurality of word line trenches and on the plurality of word lines,
wherein an uppermost surface of each of the plurality of buried insulating layers is at a same vertical level as an uppermost surface of each of the plurality of pad structures.

14. The integrated circuit device of claim 11, further comprising a plurality of buried insulating layers each inside each of the plurality of word line trenches and on the plurality of word lines,
wherein an uppermost surface of each of the plurality of buried insulating layers is closer to the substrate than an uppermost surface of each of the plurality of pad structures.

15. The integrated circuit device of claim 11,
further comprising a plurality of buried insulating layers each inside respective ones of the plurality of word line trenches and on the plurality of word lines; and
a plurality of gap-fill insulating layers on the plurality of buried insulating layers and having opposite sidewalls in contact with a pair of the one or more pad spacers included in a pair of pad structures adjacent to each other among the plurality of pad structures,
wherein an uppermost surface of each of the plurality of gap-fill insulating layers is at a same vertical level as an uppermost surface of each of the plurality of pad structures.

16. The integrated circuit device of claim 11, wherein, in each of the plurality of pad structures, the one or more pad spacers is on only the opposite sidewalls of the conductive pad among the opposite sidewalls and a top surface of the conductive pad.

17. The integrated circuit device of claim 11, wherein, in each of the plurality of pad structures, the one or more pad spacers is on the opposite sidewalls and a top surface of the conductive pad.

18. An integrated circuit device comprising:
a substrate having a plurality of active regions and a main surface;
a plurality of word lines buried in the substrate at a vertical level lower than the main surface and extending longitudinally in a first horizontal direction;
a plurality of gate dielectric layers respectively surrounding the plurality of word lines;
a plurality of bit lines extending longitudinally in a second horizontal direction perpendicular to the first horizontal direction on the substrate;
a plurality of direct contacts each between one bit line of the plurality of bit lines and one active region of the plurality of active regions;
a plurality of conductive plugs each in a space between respective ones of the plurality of bit lines on the substrate; and
a plurality of pad structures respectively between the plurality of active regions and the plurality of conductive plugs and spaced apart from the plurality of direct contacts,
wherein each of the plurality of pad structures has a first portion in contact with one active region of the plurality of active regions, and a second portion in contact with one conductive plug of the plurality of conductive plugs, each of the plurality of pad structures comprises:

a conductive pad having a bottom surface in contact with the main surface of the substrate and opposite sidewalls in the second horizontal direction; and one or more pad spacers in contact with the opposite sidewalls of the conductive pad, having a bottom surface with a vertical level equal to or higher than a vertical level of the bottom surface of the conductive pad, and comprising a portion overlapping one gate dielectric layer of the plurality of gate dielectric layers.

19. The integrated circuit device of claim 18, wherein the one or more pad spacers comprises a first pad spacer and a second pad spacer that are each in contact with a respective one of the opposite sidewalls of the conductive pad.

20. The integrated circuit device of claim 18, wherein the one or more pad spacers comprises a single pad spacer that is in contact with each of the opposite sidewalls of the conductive pad.

* * * * *